United States Patent
Lunsman et al.

(10) Patent No.: US 12,207,431 B2
(45) Date of Patent: Jan. 21, 2025

(54) SYSTEM CHASSIS WITH DIVIDER WALLS HAVING A CONCAVE EDGE

(71) Applicant: HEWLETT PACKARD ENTERPRISE DEVELOPMENT LP, Spring, TX (US)

(72) Inventors: Harvey John Lunsman, Chippewa Falls, WI (US); John Paul Franz, Tomball, TX (US); Michael Dustin Scott, Chippewa Falls, WI (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 159 days.

(21) Appl. No.: 18/176,807

(22) Filed: Mar. 1, 2023

(65) Prior Publication Data
US 2024/0298419 A1     Sep. 5, 2024

(51) Int. Cl.
*H05K 7/14*     (2006.01)
(52) U.S. Cl.
CPC .................................. *H05K 7/1489* (2013.01)
(58) Field of Classification Search
None
See application file for complete search history.

(56) References Cited

U.S. PATENT DOCUMENTS

| | | | |
|---|---|---|---|
| 3,755,630 A * | 8/1973 | Boyer | H04Q 1/142 379/325 |
| 10,474,987 B2 | 11/2019 | Corona et al. | |
| 2007/0190815 A1 * | 8/2007 | Sampson | H04Q 1/021 439/49 |
| 2010/0000950 A1 * | 1/2010 | Malekmadani | A47B 96/024 211/183 |

FOREIGN PATENT DOCUMENTS

| CN | 105430968 A | * | 3/2016 |
|---|---|---|---|
| CN | 106211691 A | | 12/2016 |

* cited by examiner

*Primary Examiner* — James Wu
*Assistant Examiner* — Christopher L Augustin
(74) *Attorney, Agent, or Firm* — Jones Robb PLLC

(57) ABSTRACT

A system chassis may comprise a frame having a width, depth, and height and a plurality of divider walls coupled to the frame and forming a plurality of receptacles each configured to receive an electronics tray containing an electronic assembly. Each of the plurality of divider walls comprises a metal sheet having a front edge, a back edge, and two lateral edges, the two lateral edges attached to two lateral walls of the frame. The front edge of the metal sheet has a concave shape such that a distance between the front edge and the back edge of the metal sheet continuously decreases while moving laterally from one lateral edge to a center of the front edge and continuously increases while moving laterally from the center to the opposite lateral edge.

21 Claims, 16 Drawing Sheets

SYSTEM CHASSIS WITH DIVIDER WALLS HAVING A CONCAVE EDGE

Some electronic systems comprise a plurality of electronic devices (e.g., servers, networking devices, power supply units, etc.) that are housed together within a shared mechanical enclosure, referred to as a system chassis. Each of these electronic devices comprises an electronic assembly (e.g., a system board with a processor and memory, etc.) and a mechanical supporting structure or enclosure that supports and/or houses the electronics assembly, which may be referred to herein as an electronic assembly tray. The electronic assembly trays may be received within corresponding slots or receptacles in the system chassis.

One or more divider walls are often included in the system chassis. The divider walls help to define the slots or receptacles into which the electronic assembly trays are received, with the divider walls being positioned as separators between the individual electronics assembly trays when the trays are assembled into the system chassis. The divider walls may aid in supporting the electronic assembly trays as well as provide signal isolation between the electronic assemblies. The divider walls are usually attached to two opposing lateral sides of the system chassis, and sometimes the divider walls are also attached to a back side of the system chassis. However, the divider walls are generally not attached to the system chassis along the front side thereof—the front of the system chassis is often left relatively open to allow for unimpeded insertion of trays. The divider walls may be constructed out of sheet metal, such as steel, and the divider walls may be relatively thin in order to limit their weight and the amount of space they occupy, as well as their cost.

Some electronic systems are configured to be installed in racks. For example, a common-rack-based system chassis has typically conformed to an Electronics Industry Association (EIA) standard EIA-310. EIA-310 allows for a number of different assembly configurations, including various heights and depths for the electronics assembly trays. However, all of these configurations fit into a system chassis that has a maximum width of 19 inches, limiting the width of the electronics assembly trays to 17.5 inches. Other system chassis may conform to other standards and/or have other dimensions.

BRIEF DESCRIPTION OF THE DRAWINGS

The present disclosure can be understood from the following detailed description, either alone or together with the accompanying drawings. The drawings are included to provide a further understanding of the present disclosure and are incorporated in and constitute a part of this specification. The drawings illustrate one or more examples of the present teachings and together with the description explain certain principles and operation. In the drawings.

DETAILED DESCRIPTION

Figure 1:
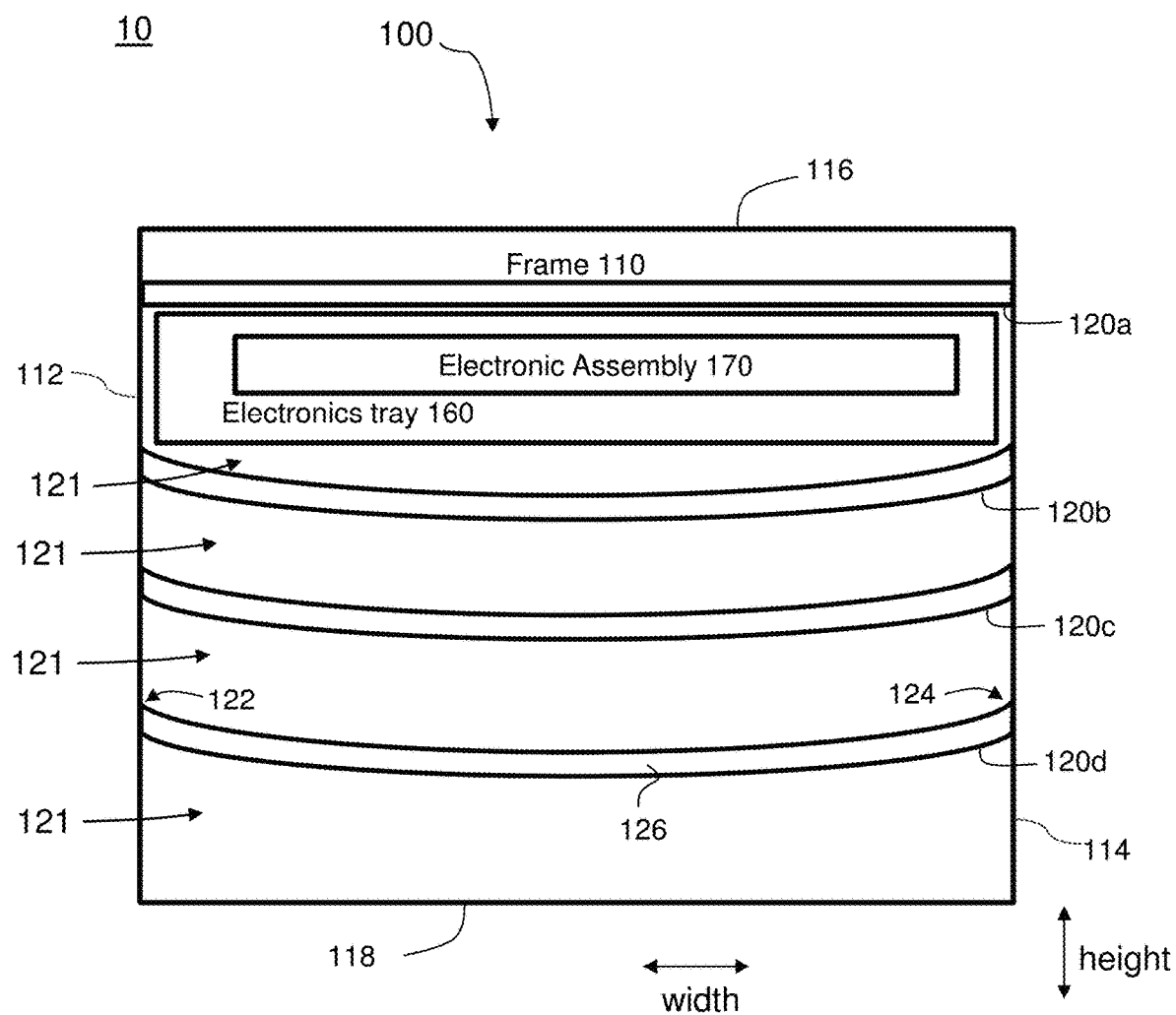
FIG. 1 is a block diagram illustrating a system comprising a system chassis.

In some system chassis, the divider walls, particularly those constructed out of thin metal, can experience some bowing. This bowing tends to occur most commonly along the front edges of the divider walls, which are not supported directly by the system chassis. In some cases, this bowing may be caused by gravity pulling on the divider walls. In other cases, this bowing may be caused by external objects "squeezing" the system chassis, such as, for example, the weight of another system that is stacked on the system chassis. If the bending or bowing becomes excessive, a user may not be able to insert an electronic assembly tray into the system chassis due to the interference between the tray and the bowing divider wall. In some cases, if it is attempted to insert an electronic assembly try into a receptacle with a bowing divider wall, the bowing divider wall may collide with and damage the physical connectors on the back of electronic assembly trays that are used for interconnecting the electronic assembly to other electronic assemblies in the system chassis.

Generally, the wider the divider walls are, the more likely that bowing will occur and the more severe the bowing will be. In particular, while bowing can sometimes occur in common rack-based system chassis that tend to be around 19 in inches wide, bowing is often a much more serious problem in wider system chassis. For example, some newer system chassis designs may be as wide as 30.5 inches or wider. In addition, the thinner the divider walls are, the more likely that bowing will occur and the more severe the bowing will be. Some newer system chassis designs may have relatively thin divider walls to allow for the electronics trays to be positioned closer together (thus increasing the number of such trays that can fit within chassis of a given size), as well as to decrease weight and costs. As a result, the wide and thin divider walls in these systems become even more prone to bending or bowing along their front edges (the edge not attached to the system chassis). In addition, in some contexts it may not be feasible to add supporting structures (such as ribs, hems, or other supporting structures) to the divider walls to prevent bowing, as in some contexts it may be desired to keep the walls thin and light and such supporting structures may result in increased thickness and/or weight.

To address the issues associated with bending/bowing divider walls, examples described herein may utilize a system chassis that includes one or more divider walls that have a concave shape along the front edge of the divider walls. In other words, instead of the front edge of the divider wall extending in a straight line perpendicular to the two lateral sides of the divider wall such that the divider wall has a substantially rectangular profile, in examples disclosed herein the front edge has a concave shape in which a center of the front edge is offset rearward relative to the two lateral sides of the front edge. More specifically, the concave shape is such that a distance between the front edge and the back edge of the divider wall continuously decreases while moving laterally from one side edge to a center of the front edge and continuously increases while moving laterally from the center to the opposite side edge. In some examples, the concave shape may be symmetrical about the center of the front edge. The concave shape may be, for instance, a "V" shape, a curved shape (e.g., a semi-circle, semi-ellipse, parabola, portion of a hyperbola, etc.), or other concave shape. In some examples, the concave shape allows the front edge to act as a lead in for engaging the electronic assembly tray so as to remove bowing of the divider wall as the electronic assembly tray is inserted between the divider walls into the system chassis. As the tray is inserted into the system chassis, the tray will initially engage with the divider wall near the two lateral sides of the front edge because these are the forward-most portions of the divider wall (due to the concave shape of the front edge). The divider wall droops very little near the lateral sides thereof (because the lateral sides are attached to the system chassis), and therefore during the initial engagement the divider wall does not interfere with or prevent insertion of the tray. Thus, the lateral side portions of the tray are able to slide under the divider wall during the initial engagement. While a significant amount of bowing may be present near the center of the front edge, during the initial engagement the center of the front edge is positioned rearward of the tray (due to the concave shape of the front edge) and therefor the drooping center portion does not interfere with the tray at this time. Moreover, as the tray continues to be inserted into the system chassis after the initial engagement, the portions of the tray that are already under the divider wall will contact the divider wall and lift up the portions of the divider wall that are not yet in contact with the tray but which are adjacent to a leading point of contact between the tray and divider wall. This lifting up of the divider wall at the leading points of contact avoids interference that may otherwise have occurred and thus allows for the tray to be further inserted. As the tray is inserted, the leading contact points between the divider wall and a leading edge of the electronics tray advance along the front edge from the side edges of the divider wall toward the center of the front edge, with the tray progressively lifting more and more of the divider wall along the way. The advancing of the contact points increases the region of contact/overlap between the divider wall and the electronics tray, slowly reducing the amount of bending or bowing in the divider wall. When the insertion reaches the center point of the front edge of the divider wall, the bending or bowing may be substantially or completely removed, reducing or eliminating interference between the electronics tray and the divider wall.

In some examples, one or more of the divider walls may include two support structures extending along each of the two side edges of the divider wall. The two support structures may be used to attach the divider wall to the system chassis. For example, the support structure may be flanges that are integrally coupled and perpendicular to a flat portion of the divider wall.

In some examples, the system chassis may be configured to operate as compute system with a plurality of electronics trays containing electronic assemblies. The electronic assemblies may comprise, for example, compute nodes, a storage nodes, a switches or other networking devices, a communication interface node, and the like.

Turning now to the figures, various devices, systems, and methods in accordance with aspects of the present disclosure will be described.

FIG. 1 is a block diagram conceptually illustrating a system 10 comprising a system chassis 100. It should be understood that FIG. 1 is not intended to illustrate specific shapes, dimensions, or other structural details accurately or to scale, and that implementations the system 10 and system chassis 100 may have different numbers and arrangements of the illustrated components and may also include other parts that are not illustrated.

As shown in FIG. 1, the system 10 comprises a system chassis 100, and the system chassis 100 comprises a frame 110 and a set of divider walls 120a-120d. The frame 110 and the set of divider walls 120 are coupled together in a manner to form a set of receptacles 121. Specifically, each pair of adjacent divider walls 120, together with portions of the frame 110, may define and partially enclose an open volume corresponding to one of the receptacles 121. The receptacle 121 may be configured to receive an electronics tray 160. In some examples, the system 10 comprises one or more such electronics trays 160. For example, in FIG. 1 an electronics tray 160 is shown in the receptacle 121 formed by the divider walls 120a and 120b and the frame 110. As shown, one electronics tray 160 is present, however, frame 110 is configured to accommodate any number of electronics trays similar to electronics tray 160. The electronics tray 160 further includes an electronic assembly 170, which is described below. In some examples, the system 10 comprises the frame 110 without any of the electronics trays 160 installed therein.

For convenience, the system 10 is described herein relative to the orientation shown in FIG. 1 in which the divider walls 120 are generally horizontal, and directional terms used herein for various components of the system 10 such as "lateral," "top", "bottom" and so on are used herein relative to this illustrated orientation. However, it should be understood that the system 10 could have other orientations and configurations, as described in greater detail below, in which case directional terms used herein with reference to the illustrated orientation may differ in the other orientation. For example, a "top" of the frame 110 in the orientation of FIG. 1 may become a lateral side of the frame 110 if the chassis 100 is rotated 90-degrees.

The frame 110 can be in the general shape of a hollow cube or a hollow rectangular cuboid (with one or more sides thereof being omitted or being discontinuous and/or having openings formed therein) having a height, width and depth that can accommodate one or more electronics trays 160. Width and height dimensions are indicated in FIG. 1, with the depth dimension being perpendicular to the width and height dimensions (i.e., extending into the page in FIG. 1). The frame 110 can be formed out of a suitable structural material. Suitable structural materials include, but are not limited to, metals such as steel, copper, brass, aluminum, or other relatively rigid materials such as plastics. In one example, the frame 110 is formed out of steel and has a height of 48 inches, a width of 30.5 inches, and a depth of 24 inches. In some implementations, all or part of the frame 110 may include a subframe formed out of structural rails and cross-members that create a skeleton having the desired dimensions for use with the frame 110. One or more panels or other structures may be attached to the subframe to form an outer shell having at least a top wall 116, a bottom wall 118, and two lateral walls 112 and 114. These panels or walls may be formed, for example, from sheet metal. In some examples, the shell of the frame 110 may also comprise a back wall (not illustrated). In some examples, the back wall is discontinuous (i.e., formed from multiple parts that are not necessarily directly coupled together) and/or has one or more openings to allow for routing of cables or other infrastructure and/or to allow for airflow. The front side of the frame 110 may lack a wall or panel in some examples to allow for insertion and removal of the electronics trays 160. In other examples, the frame 110 may comprise a front wall or panel or door (not illustrated) which is removable or which can be opened (e.g., on a hinge) to allow for insertion or removal of the electronics trays 160, but in such examples the divider walls 120 are not affixed to the front wall/door.

Herein, reference will occasionally be made to the top, bottom, front, back, and lateral sides of the frame 110 or of the system chassis 100. It should be understood that these terms refer generally to the locations or regions associated with sides or faces of the frame 110. For example, references to the top, bottom, and lateral sides of the frame 110 refer generally to the regions at or around the top wall 116, bottom wall 118, and lateral walls 112 and 114, respectively. References to the front and back of the frame 110 may refer generally to the other two sides of the frame 110 which are perpendicular and tangent to the top, bottom, and lateral walls 116, 118, 112, and 114. Note that the front and back sides do not necessarily have any corresponding walls located therein. As used herein, the "front" side is distinguished from the back side in that the front side is the side from which the electronics trays 160 are inserted into the system chassis 100.

In some examples, the frame 110 may also comprise additional structures (not illustrated), such as intermediate vertical or horizontal walls that are coupled to other portions of the frame, such as any of the walls 112, 114, 116, and 118. These intermediate vertical or horizontal walls may, for example, define additional compartments or receptacles for housing other components of the system 10.

Each of the divider walls 120 comprises a metal sheet having a width similar to the width of the frame 110. The metal sheet may be substantially flat. In some examples, the metal sheet may include features, such as ribs or detents, in its surface. The depth of the divider walls 120 may vary but is typically similar to the depth of the frame 110. The metal used to form the divider walls 120 may include, but is not limited to, steel, copper, brass, and aluminum. In one example, the divider walls 120 are made from steel sheet metal. In some examples, the divider walls are 0.71 mm (0.028 in) thick. In some examples, the divider walls are 1.01 mm (0.040 in) thick. In some examples, the divider walls are between 0.71 mm (0.028 in) and 1.01 mm (0.040 in) thick. In some examples, the divider walls are less than 0.71 mm (0.028 in) thick. In some examples, the divider walls are more than 1.01 mm (0.040 in) thick. In some examples, the divider walls are substantially flat with no added features in order to minimize weight as and to reduce the amount of space occupied by the divide walls 120 within the frame 110.

Each of the divider walls may be coupled to the frame 110 using a suitable attachment mechanism. In some examples, the attachment mechanism may include attaching each of the divider walls 120 to a portion of the lateral sides of the frame 110 using mechanical fasteners, such rivets, bolts, or other fasteners. In other examples, each of the divider walls 120 may be attached to a portion of the lateral sides of the frame 110 through soldering, brazing, welding, adhesive, interlocking joints, or any other attachment mechanism. More specifically, in some examples one lateral edge 122 of the divider wall 120 is coupled to lateral wall 112 and an opposite lateral edge 124 of the divider wall 120 is coupled to lateral wall 114. In other examples, one or both lateral edges 122 or 124 of the divider walls 120 are coupled to intermediate structures (not illustrated), such as intermediate vertical walls (not illustrated) that extend vertically between the top and bottom sides of the frame 110. Although the divider walls 120 are shown in FIG. 1 as extending horizontally and being coupled to lateral walls 112 or 114, this is just one possible configuration and the divider walls 120 could be configured otherwise. For example, the divider walls 120 could extend vertically and be coupled to top and bottom walls 116 and 118. The divider walls 120 extending horizontally as illustrated in FIG. 1 may be referred to as a horizontal configuration of the system chassis 100, while the divider walls 120 extending vertically may be referred to as a vertical configuration. The principles of the present disclosure may equally apply regardless of the orientation of the system chassis 100. In implementations in which the system chassis 100 has an orientation different than that illustrated, it should be understood that the directional terms used herein would be translated accordingly, e.g., that which is described as located on a "lateral side" of the chassis 100 in relation to the horizontal configuration shown in FIG. 1 may be located on a "top" or "bottom" side of the chassis 100 in a vertical configuration.

The electronics tray 160 is shaped to fit within the receptacles formed by the divider walls 120 and the frame 110. In some examples, the electronics tray 160 has the general shape of a cube or a rectangular cuboid having a height, width and depth. The electronics tray 160 can be formed using structural materials similar to those used for the frame 110. In one example, the electronics tray is formed out of steel and has a height of 1.75 inches, a width of 30.5 inches, and a depth of 24 inches. In some implementations, all or part of the electronics tray 160 may include a subframe structure similar to that described above for frame 110.

The electronics tray 160 includes an electronic assembly 170. Electronic assembly 170 includes a plurality of electronic components electrically coupled together that form all or a part of an electronic device capable of performing some function or operation. Examples of electronic devices include, but are not limited to, a compute node, a storage node, a switch or other networking device, a power supply unit, and a communication interface node. In some implementations, the electronics tray may include one or more electrical connectors that provide an interface between electronic assembly 160 and other electronic components, such as other electronic assemblies 160 in electronic trays 170 as part of system chassis 100 or external to system chassis 100. In some examples, power and/or communication connectors (not illustrated) may be disposed within the system chassis 100 at locations corresponding to the receptacles 121 so as to connect via blind-mating with complementary connectors disposed on or in a rear face of the electronics tray 160 when the electronics tray is inserted into the corresponding receptacle 121. These connectors may be disposed on a midplane or backplane PCB (not illustrated) which extends perpendicular to the divider walls 120 and the lateral walls 112 and 114, which may allow for the various electronic assemblies 170 installed in the system 10 to be interconnected. In some examples, power and/or communication cables may be used, in addition to or in lieu of a midplane or backplane PCB, to interconnect the various electronic assemblies 170 with one another and/or with other devices.

In FIG. 1, divider walls 120b-120d are shown as bowed or bent downward (the bowing is exaggerated in the figure to aid visualization, but the figure is not intended to depict actual dimensions or the actual extent of the bowing). The downward bending or bowing, also referred to as droop, may be due to, for instance, a force of gravity on the horizontally oriented divider walls 120b-120d (in the horizontal configuration of the system chassis 100). In addition, the bowing may also be due to forces applied to the frame 110 that squeeze the frame 110. Thus, although the bowing is shown as downward in FIG. 1, in some cases, one or more of the horizontally oriented divider walls 120 may bend or bow upward due to, for instance, a force applied to the sides of the frame 110. In other implementations using the vertical configuration of the system chassis 100, the vertically oriented divider walls 120 may bend laterally due to, for instance, to forces applied to the top and/or the bottom of the frame 110 (e.g., due to another object being stacked on the frame 110).

Figure 3:
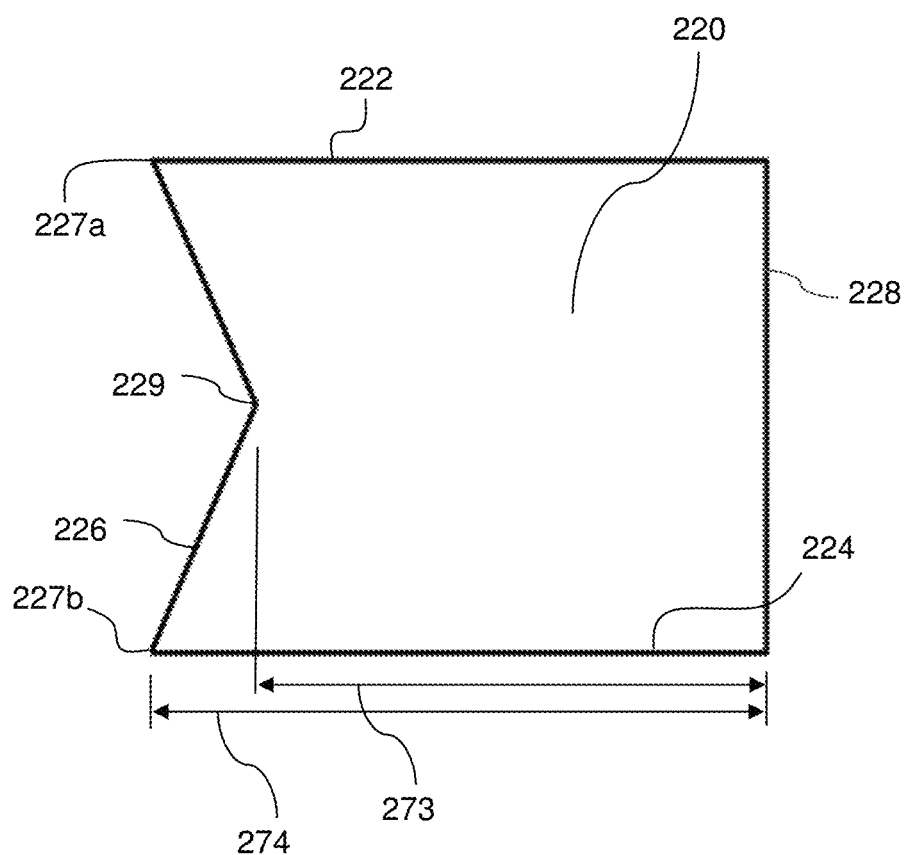
FIG. 3 shows a top view of a divider wall of the system chassis of FIG. 2A.
Figure 10:
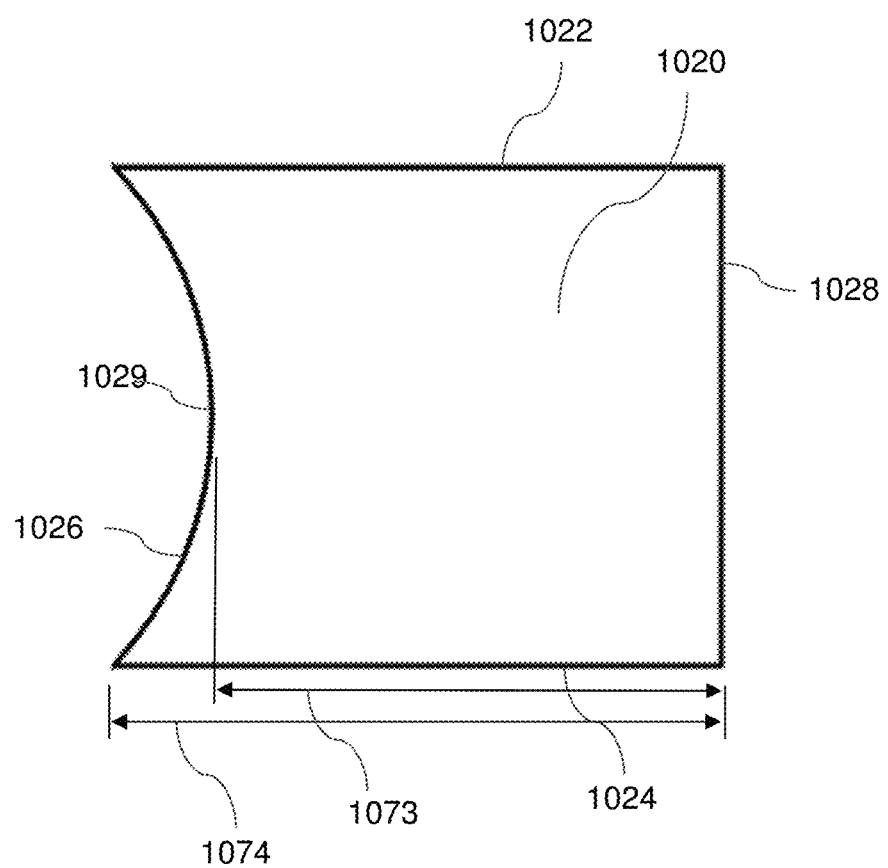
FIG. 10 shows top view of another divider wall.

In FIG. 1, the divider wall 120a is shown as flat and straight, whereas the other divider walls 120b-120d are shown as bowing. Divider wall 120a is flat as a result of the insertion of the electronics tray 160 into the receptacle formed by the divider walls 120a and 120b along with the frame 110. In other words, divider wall 120a initially included a droop similar to divider walls 120b-120d, prior to insertion of the electronics tray 160. Each of the divider walls 120a-120 include a front edge 126 (only one is labeled in FIG. 1) that has a concave shape when viewed from a perspective above or below the divider wall 120, similar to the perspectives shown in FIGS. 3 and 10. This concave shape is such that the distance between the front edge and the back edge (not illustrated) of the divider wall 120 continuously decreases while moving laterally from either lateral side of the front edge 126 (the sides of the front edge 126 that are adjacent to the lateral edges 122 and 124 of the divider wall 120) to the center portion of the front edge 126. In other words, when moving laterally along the front edge 126 from lateral edge 122 to lateral edge 124, the front-to-back distance decreases continuously from the lateral edge 122 until reaching an inflection point at the center portion, and after the inflection point the front-to-back distance now increases continuously moving from the center portion to the lateral edge 124. Thus, the lateral sides of the front edge 126 (adjacent to the lateral edges 122 and 124) are positioned farther forward than any other portions of the front edge 126, and the front edge 126 may have an inflection point or minimum at the center portion of the front edge 126, with this inflection point being the portion of the front edge 126 that is located the farthest rearward. The concave shape of the front edge 126 may include, for example, a concave shape formed from two or more line segments connected together, such as a V-shape. For example, FIG. 3 illustrates one example configuration of the divider walls 120 (in the form of divider wall 220) having a V-shaped front edge. As another example, the concave shape of the front edge 126 may include a curved or arched shape, such as a semicircle, semi-ellipse, parabola, hyperbola (or portion thereof), pointed arch, or other curve. For example, FIG. 10 illustrates one example configuration of the divider walls 120 (in the form of divider wall 1020) having a curved front edge. As another example, the concave shape may comprise a combination of curved and linear segments. The inclusion of the concave shape of the front edge 126 prevents interference between the divider wall 120a, initially having droop, and the electronics tray 160 during the initial point of insertion. As the insertion process is continued, the droop in divider wall 120a is gradually removed, leaving divider wall 120a relatively flat, as shown.

As noted above, the receptacles 121 are generally defined (i.e., bounded) by a pair of adjacent divider walls 120, together with portions of the frame 110. However, in some examples one or more of the receptacles 121 may be defined by a single one of the divider walls 120 together with other portions of the frame 110. For example, in some examples, a top-most receptacle 121 is bounded by a top-most one of the divider walls 120 and the top wall 116. As another example, in some cases a bottom-most receptacles 121 is bounded by a bottom-most one of the divider walls 120 and the bottom wall 118 of the frame 110.

Turning now to FIGS. 2-7, a system chassis 200 in accordance with various aspects of the disclosure will be described. The system chassis 200 may be one configuration of the system chassis 100 described above. Thus, various components of the system chassis 200 may be similar to components of the system chassis 100 described above. The above descriptions of components of the system chassis 100 are applicable to the similar components of the system chassis 200, and thus duplicative descriptions are omitted below to improve clarity. Similar components of the system chassis 100 and 200 are given reference numbers having the same last two digits, such as 110 and 210. Although the system chassis 200 may be one configuration of the system chassis 100, the system chassis 100 is not limited to the configuration of system chassis 200.

Various elements of the system chassis 200 or components thereof are illustrated in multiple figures. As elements are described below, one or a few figures which are thought to be particularly pertinent to the element being described will be noted, and thus the description below will not necessarily describe FIGS. 2-7 separately and in strict sequence but will instead move back and forth between various figures. In addition, it should be understood that when certain figures are referred to in relation to a particular element, other figures besides those that are identified may also illustrate the same part from other perspectives.

Figure 2A:
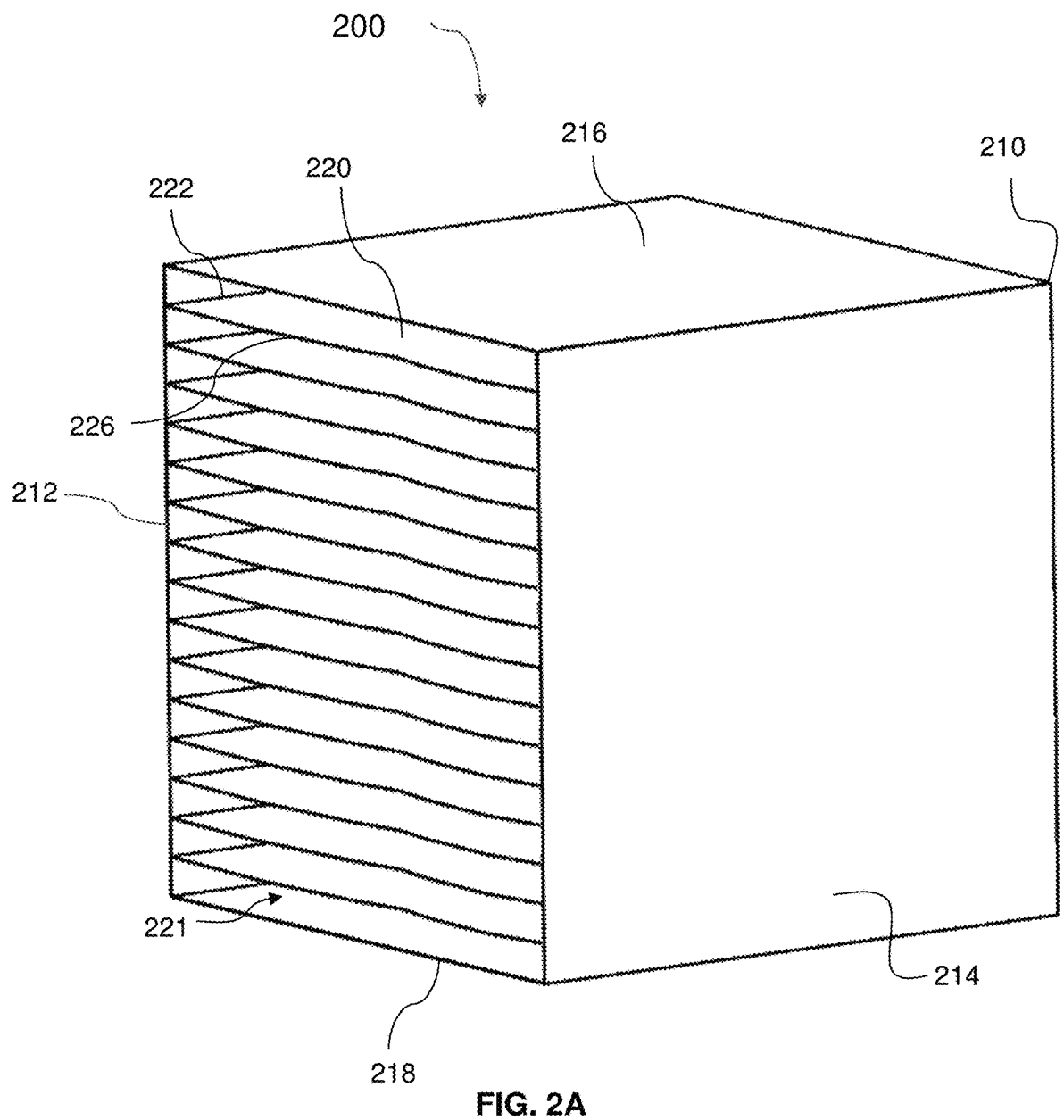
FIG. 2A shows a perspective view of a system chassis.
Figure 2B:
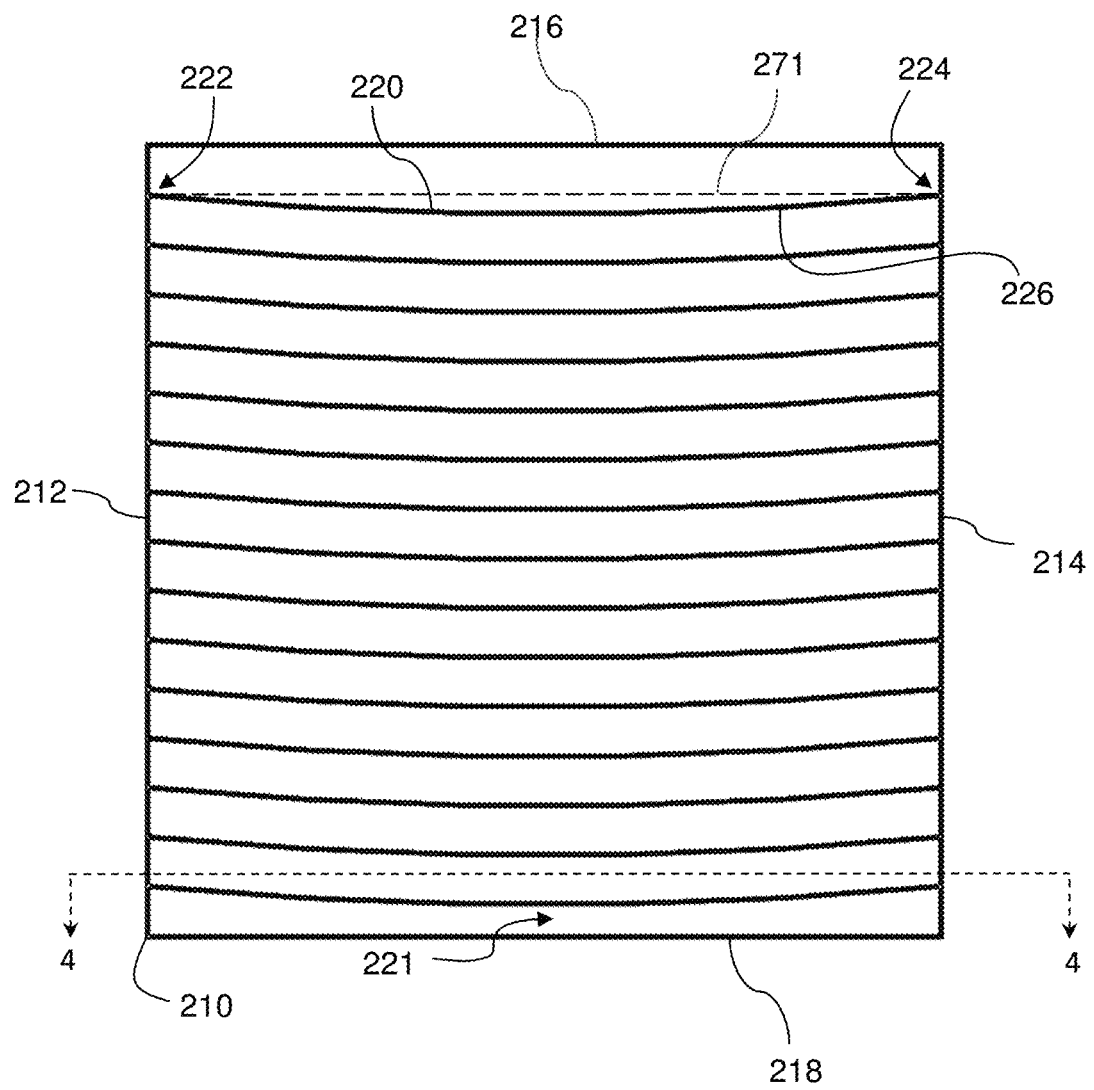
FIG. 2B shows a front view of the system chassis of FIG. 2A.

FIGS. 2A and 2B show a perspective view and a front view of the system chassis 200, respectively. The system chassis 200 comprises a frame 210. The frame 210 has a top wall 216, lateral walls 212 and 214, and a bottom wall 218. The top wall 210, lateral walls 212 and 214, and bottom wall 216 are formed from one or more steel sheets. The frame 210 has rectangular openings at the front and the back of the frame 210. The frame includes a plurality of divider walls 220 having a front edge 226 and lateral side edges 222 and 224 (only one of the divider walls 220 is labeled in FIGS. 2A and 2B). The divider walls 220 also have a back edge 228 that is not visible in FIGS. 2A and 2B but is shown in FIG. 3 (and others). The front edge 226 shown in FIG. 2A has a concave shape, tapering inward from the lateral side edges 222 and 224 towards the center of the front edge 226. The side edges 222 and 224 are attached to the inner surface of the lateral walls 212 and 214 of the frame 210, respectively.

Each of the divider walls 220 are shown in FIG. 2B having a bend or bow across the front edge 226. As shown in FIG. 2B, the bend or bow is notably identified with respect to a dashed line 271 that is level across the width of the frame 210 from one corner edge 222 to the other corner edge 224, shown from the side, with the dashed line 271 indicating a nominal position of the divider wall 220 if no bowing were present. Note that the bowing depicted in FIG.

2B is exaggerated to make it more visually apparent, and actual dimensions are not depicted.

FIG. 3 is a top view of one of the divider walls 220, with the remainder of the system 200 omitted from the view. The concave shape of the front edge 226 has a V-shape toward the back edge 228. The distance from the front edge 226 to the back edge 228 (along a line parralel to the lateral edges 212 and 214) is at a maximum at the lateral sides 227a and 227b of the front edge 226 (at the junction of the front edge 226 with the lateral edges 212 and 224). This maximum value of the front-to-back distance is shown in FIG. 3 as distance 274. The distance between the front edge 226 and the back edge 228 continuously decreases while moving along the front edge 226 from the lateral side 227a to a center point 229. At the center point 229, the front-to-back distance reaches a minimum value, shown as distance 273. Notably, the front-to-back distance decreases linearly while moving from the lateral side 227a to the center point 229. Similarly, when moving along the front edge 226 from the lateral side 227b to the center point 229, the distance from the front edge 226 to the back edge 28 decreases continuously from the maximum value at the lateral side 227b to the minimum value at the center point 229. Thus, the front edge 226 is symmetric about the center point 229.

The difference between the distance 274 and the 273, which may be referred to as the depth of the concave shape, may depend on several factors, such as the width of the divider walls 220 and the material or thickness of the divider walls 220 as well as orientation of the system chassis 220. Each of these factors can affect the amount of bend or bow (e.g., droop) that is present in the divider walls. The larger amount of bend or bow may require increased depth of the concave shape in order to prevent excess binding during contact between the electronics tray and the divider wall. In some examples, the depth of the concave shape is three inches. In other examples, the depth may have a different value, including values greater or less than three inches.

Figure 4A:
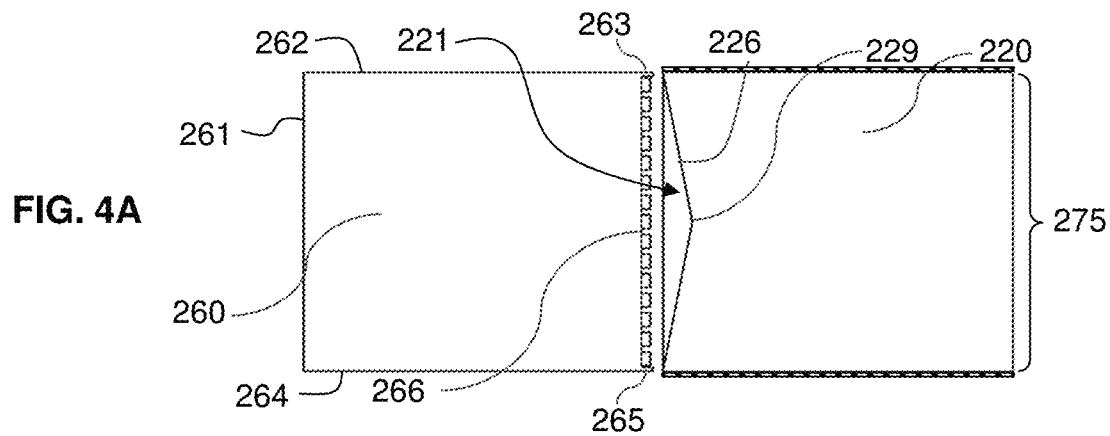
FIGS. 4A-4D show a top view of an electronics tray along with a cross section view of the system chassis in FIG. 2A with the section taken along 4-4 in FIG. 2 during various stages of attachment of the electronics tray to the system chassis.
Figure 4B:
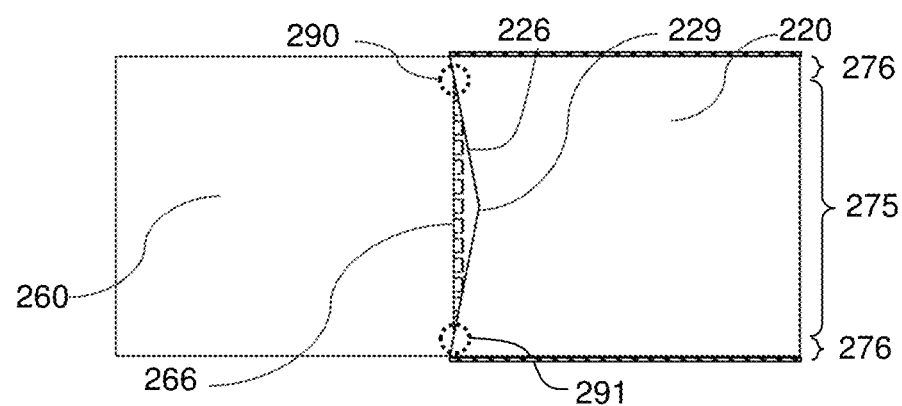
Figure 4C:
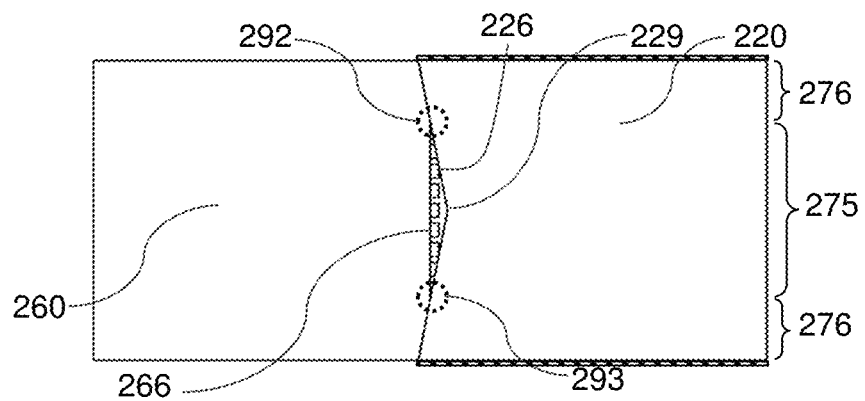
Figure 4D:
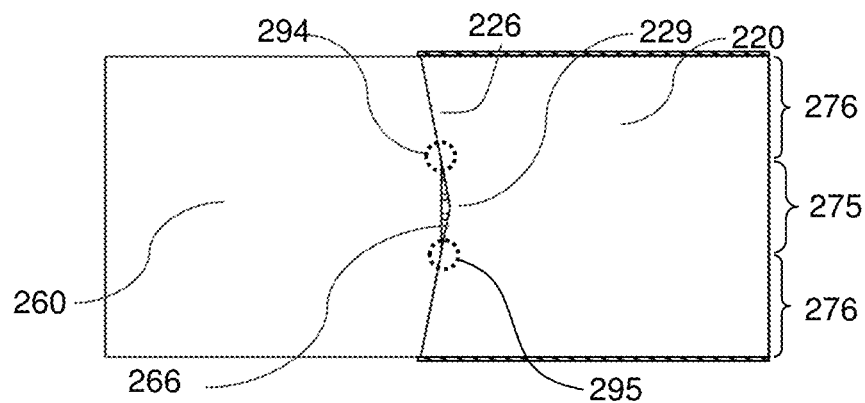
Figure 5A:
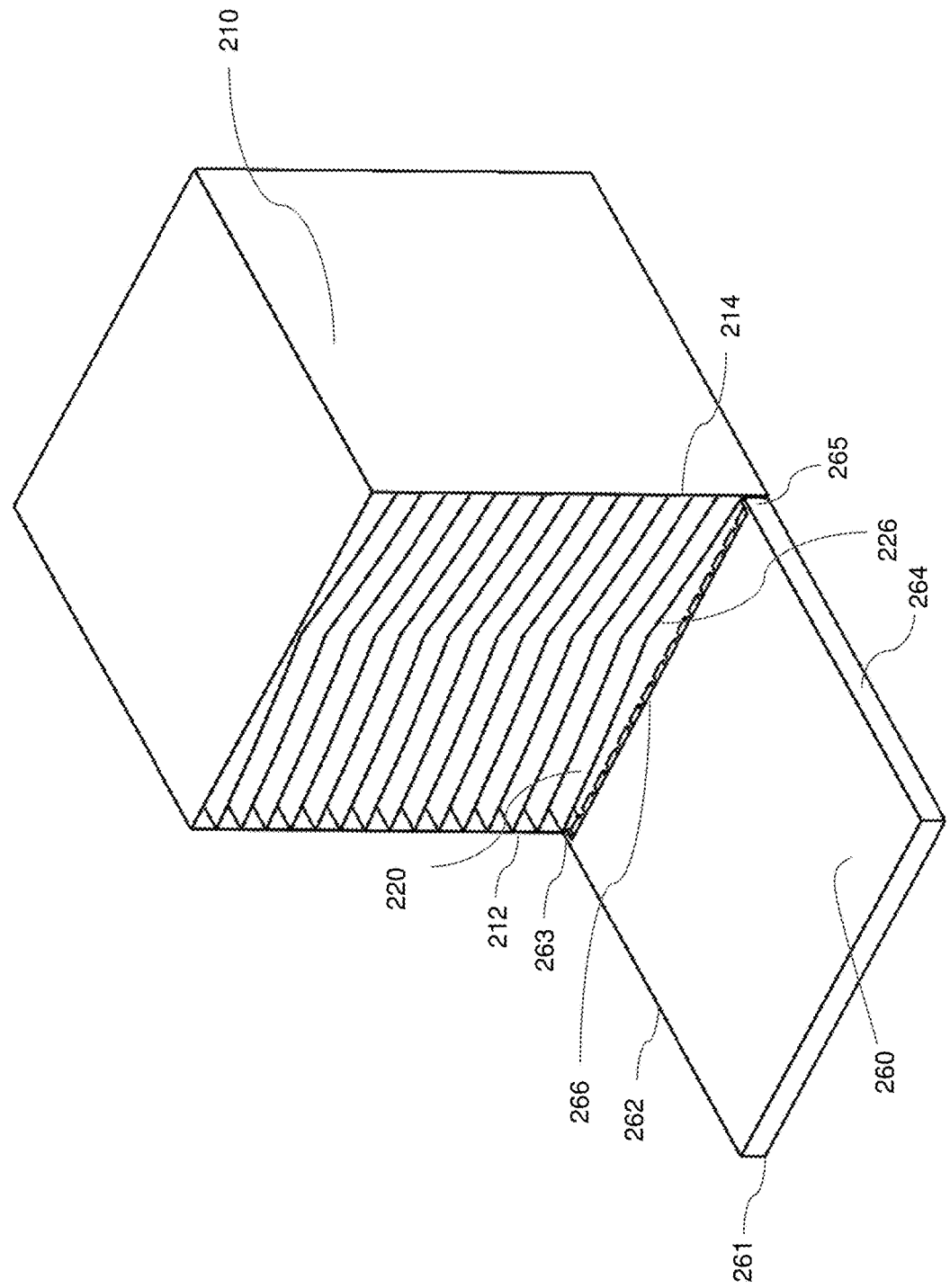
FIGS. 5A-5D show a perspective view of the electronics tray along with the system chassis of FIGS. 4A-4D during various stages of attachment of the electronics tray to the system chassis.
Figure 5B:
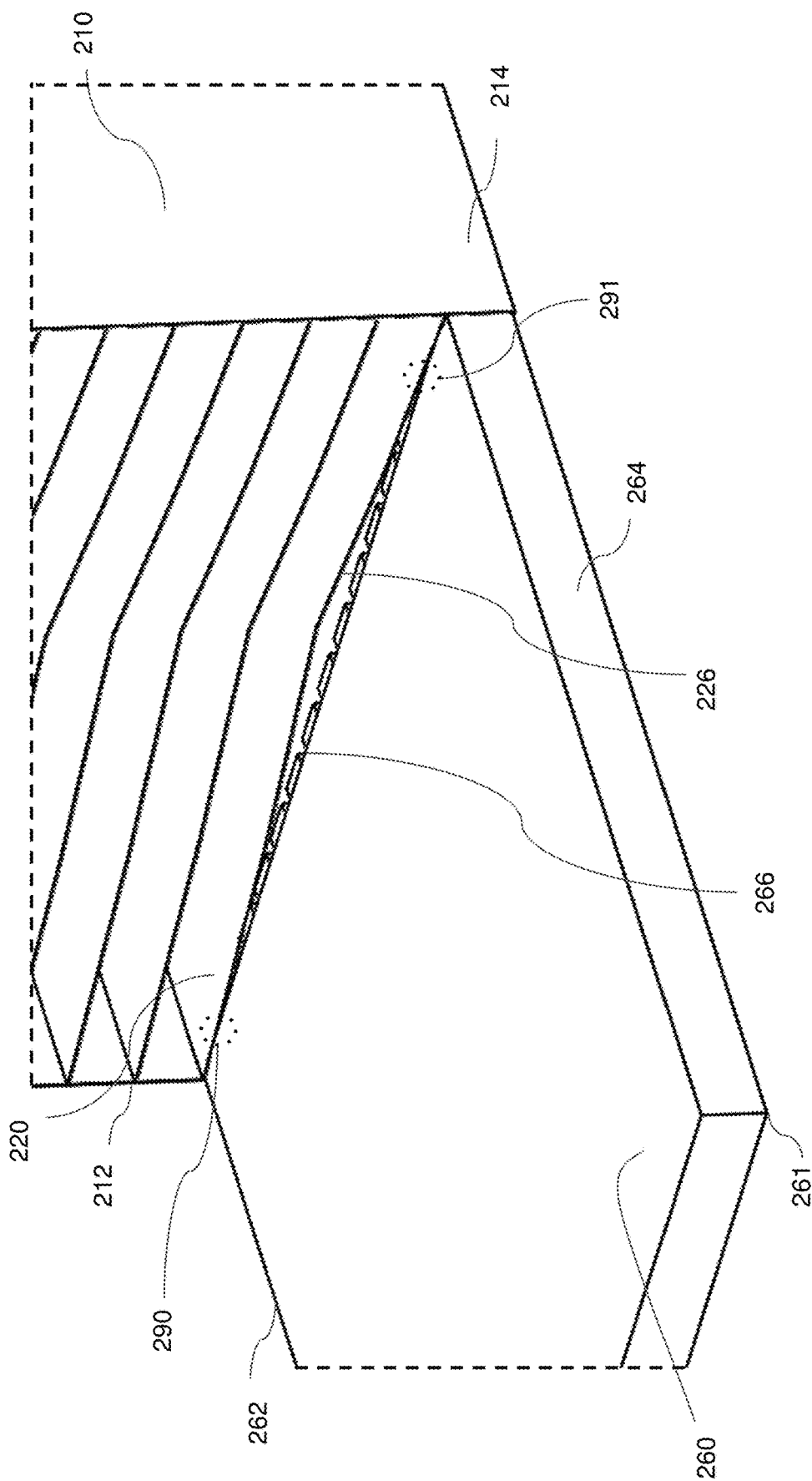
Figure 5C:
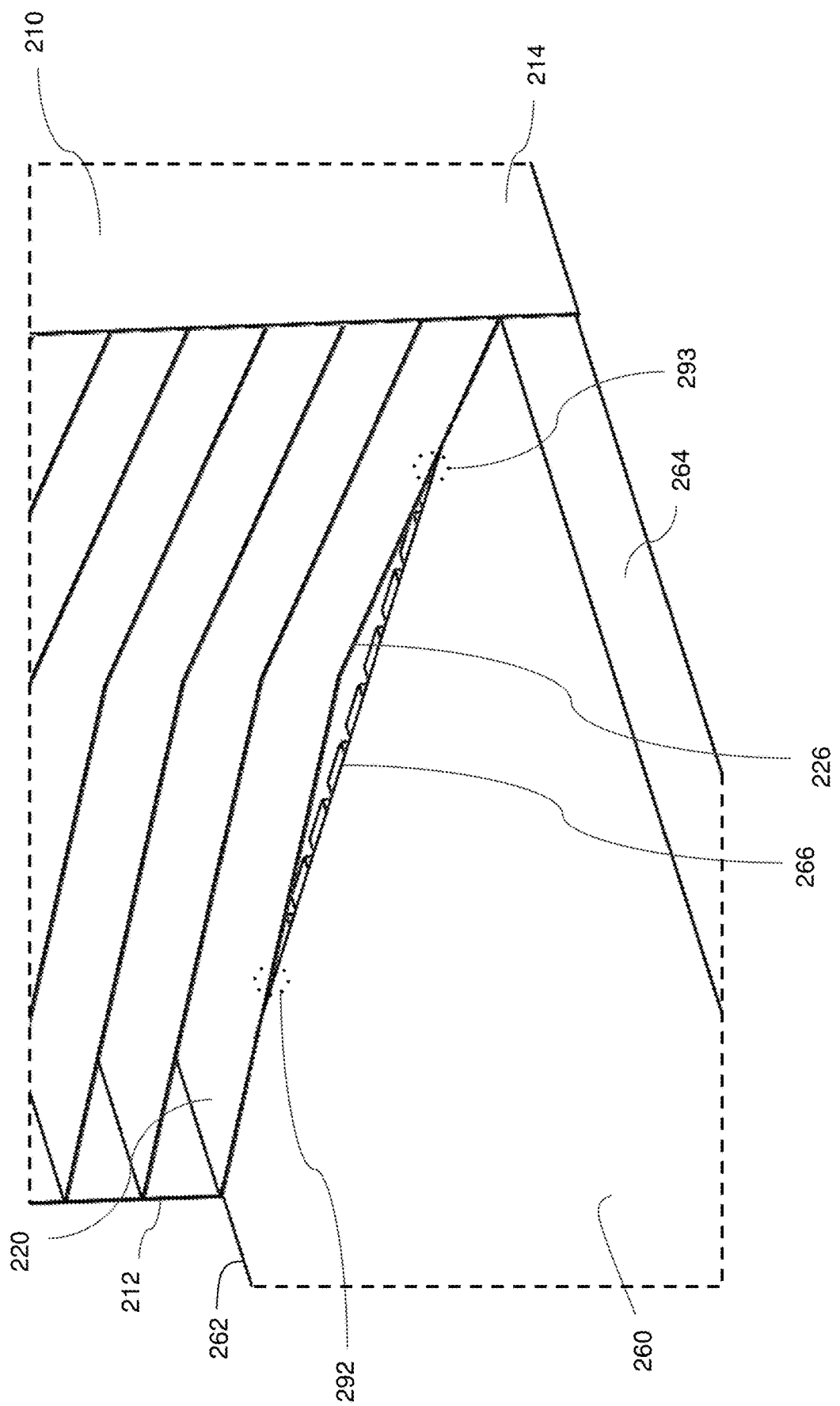
Figure 5D:
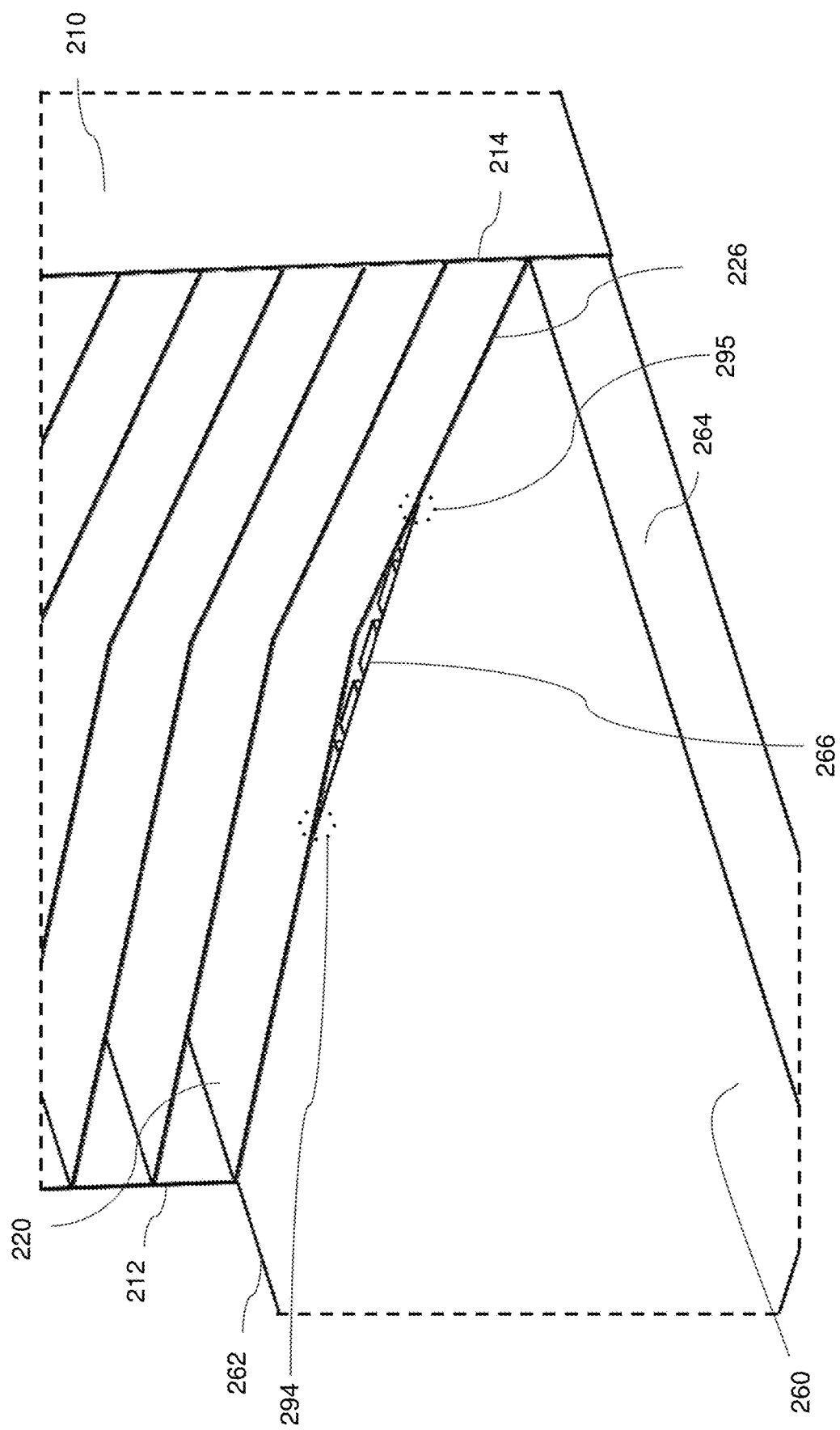
Figure 6A:
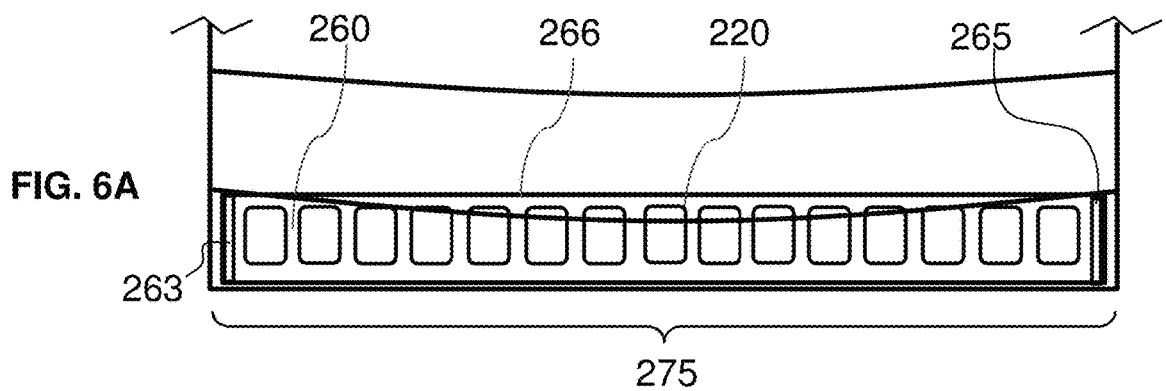
FIGS. 6A-6D show a rear view of the electronics tray along with the system chassis of FIGS. 4A-4D during various stages of attachment of the electronics tray to the system chassis.
Figure 6B:
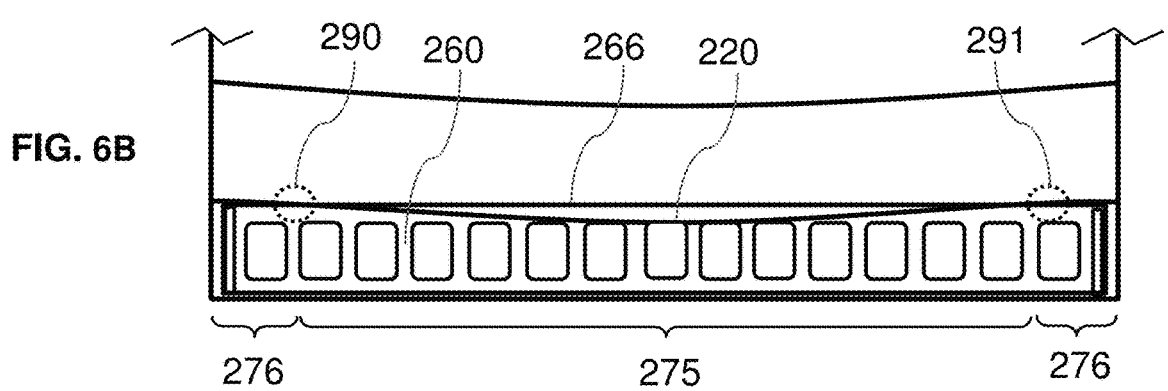
Figure 6C:
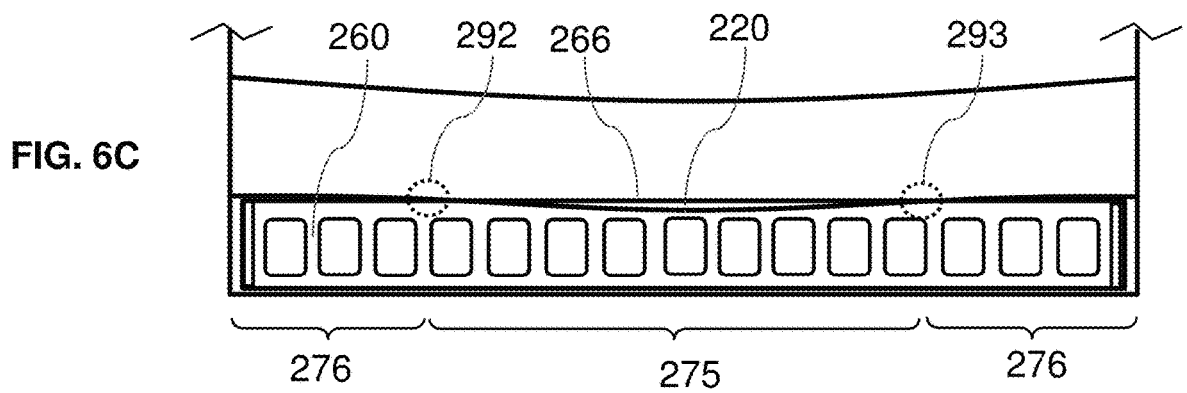
Figure 6D:
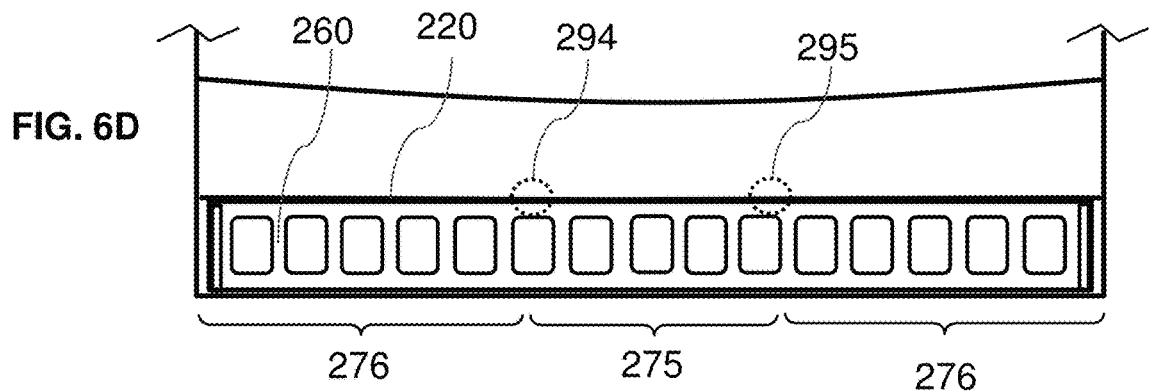

FIGS. 4A-4D, 5A-5D, and 6A-6D show four different states in a process of installation of an electronics tray 260 into the system chassis from three different views. In particular, FIGS. 4A, 5A, and 6A show a first state, FIGS. 4B, 5B, and 6B show a second state, FIGS. 4C, 5C, and 6C show a third state, and FIGS. 4D, 5D, and 6D show a fourth state. The electronics tray 260 is installed in the frame 210 by inserting the electronics tray 260 into a receptacle 221. The receptacles 221 are formed by one of the divider walls 220, the two lateral walls 212 and 214, and either another adjacent one of the divider wall 220 or another portion of the frame such as the top wall 216 or bottom wall 218. In FIGS. 4A-6D, the receptacle 221 into which the tray 260 is inserted is the lowest receptacle 221 which is defined between one of the divider walls 220 and the bottom wall 218 of the frame 210. FIGS. 4A-4D comprise cross-sections taken along 4-4 in FIG. 2B, showing the top of divider wall 220 in the frame 210 along with the electronics tray 260. FIGS. 5A-5D show perspective views of the electronics tray 260 and the receptacle 221 in the frame 210. FIGS. 6A-6D show rear views of the electronics tray 260 and the receptacle 221 in frame 210.

FIGS. 4A, 5A, and 6A shows the electronics tray 260 at a point of alignment with the receptacle 221 in the frame 210. In some implementations, guide structures (not shown), such as rails or grooves may be included on one or both of the lateral walls 212 and 214 of the frame 210 between the divider walls 220. Additionally, complementary guide structures may be added to the electronics tray 260 to engage with the guide structures of the frame 210. The electronics tray 260 comprises a frame 261, and in some examples the complementary guide structures may be disposed on or in sides 262 and 264 of the frame 261. As shown in FIGS. 4A and 5A, the frame 261 may include guide tabs 263 and 265 located adjacent to, or formed as part of, the sides 262 and 264. The guide tabs 263 and 264 are protrude rearward beyond the leading edge 266 of the frame 261, located along the back of the electronics tray 260 and align with the bottom surface of the divider wall 220 along each side edge 222 and 224.

FIGS. 4A-4D illustrate regions 275 and 276, with regions 275 corresponding to regions of no contact or overlap between the divider wall 220 and frame 261 and regions 276 corresponding to regions of contact or overlap between the divider wall 220 and frame 216. In the state shown in FIG. 4A, 5A, and 6A, the tray 260 is not yet inserted into the receptacle 221 and so there is no contact/overlap between the divider wall 220 and frame 261, as indicated by the region of no contact 275 spanning the width of the divider wall 220. As shown in FIG. 6A, in this state there is a large amount of bowing in divider wall 220, with the divider wall 220 drooping down below the top surface of the tray 260. Thus the divider wall 220 would interfere with the tray 260 and block its insertion if the divider wall 220 were of conventional configuration without the concave front edge. However, as will be described below, because the divider wall 220 has the concave front edge 226, this bowing will not prevent insertion of the tray 260.

After the first state illustrated in FIGS. 4A, 5A, and 6A, the tray 260 may initially be inserted into the receptacle 221. In examples in which the electronics tray 260 comprises tabs 263 and 265, the tabs 263 and 265 may be the first parts of the tray 260 that enter the receptacle 221. There is very little to no droop of the divider wall 220 near the lateral sides thereof (because the divider wall 220 is attached to the frame 220 near the lateral sides), and therefore the tabs 263 and 265 can fit under the divider wall 220 without interference. In some examples, the tabs 263 and 265 may comprise sloped or rounded lead-in features on a top side thereof to ensure the tabs 263 and 265 slide under the divider wall 220 without interference. As the tabs 263 and 265 slide under the divider wall 220, they may make contact with the bottom side of the divider wall 220 and this may serve to slightly lift the portions of the divider wall 220 that are immediately adjacent to the tabs 263 and 265. This ensures that when the leading edge 266 of the tray 260 eventually reaches the front edge 263, the leading edge 266 is able to pass under the front edge 263 (at least in the region immediately adjacent to the tabs 263 and 265).

In other examples, the tabs 263 and 265 are omitted, in which case the lateral sides of the leading edge 266 may be the first portion of the leading edge 266 to engage the front edge 263. In such cases, the lateral sides of the leading edge 266 may be able to slide under the divider wall 220 for the same reasons that the tabs 263 and 265 are able to slide under the divider wall 220 (i.e., they are located near the lateral edges, where little to no droop is present).

FIGS. 4B, 5B, and 6B shows the electronics tray 260 slightly after an initial point of insertion into the receptacle in the frame 210. The state illustrated in FIGS. 4B, 5B, and 6B represents the point of first or initial contact between the leading edge 266 of the electronics tray 260 and the front edge 226 of divider wall 220. The points of contact between the leading edge 266 of tray 260 and the front edge 226 of divider wall 220 are indicated by contact zones 290 and 291 in FIGS. 4B, 5B, and 6B. Those portions of the leading edge 266 that are closer to the center point 229 than the contact zones 290 and 291 have not yet made contact with the front edge 226, while those portions of the leading edge 266 that are farther from the center 229 than the contract zones 290 and 291 have already passed under the front edge 226. In this state, portions of the frame 261 have passed under the divider wall 220, as indicated by the regions of contact or overlap 276. These regions of contact/overlap 276 correspond to regions located between the lateral edges 222 and 224 of the divider wall 220 and the contact zones 290 and 291. At this initial point of insertion, the contact zones 290 and 291 are notably very close to the lateral edges 222 and 224, and thus the regions of contact or overlap 276 are small. The remaining portion of front edge 266 not in the regions of contact 276 is still in the region of no contact or overlap 275. In some implementations, the guide structures described above, such as guide tabs 263 and 264 may assist with the engagement of the electronics tray into frame 210. As shown in FIG. 6B, some amount of droop in divider wall 220 still remains but is less than the amount of droop present in FIG. 6A. The contact between the tray 260 and the divider wall 220 at the contact zones 290 and 291 reduces the amount of droop because the tray 260 now supports a portion of the front edge 226 of the divider wall 220, and thus the portion of the front edge 226 that is unsupported is shorter than it previously was.

As the tray 260 is inserted farther into the receptacle 221, the leading edge 266 slides against the front edge 226 and the points of contact between the leading edge 266 and the front edge 226 progressively move inward towards the center point 229, as can be seen by comparing FIGS. 4A, 4C, and 4D. The points of contact move inwards toward the center point 229 as the tray 260 is inserted due to the concave shape of the front edge 226. Because the leading edge 266 is in contact with the bottom of the divider wall 220 at the points of contact, as the points of contact move farther inward, the tray 260 progressively lifts the divider wall 220 more and more until the droop is effectively eliminated. At various points during this insertion process, portions of the divider wall 220 that are near the center point 229 may experience some bowing/droop, as shown in FIGS. 6B and 6C, but this bowing at the center 229 does not prevent further insertion because, due to the convex shape of the front edge 226, the bowing portions near the center 229 are located rearward of the tray 260, as shown in FIGS. 4B, 4C, 5B, and 5C, and thus these bowing portions do not interfere with the tray 260. By the time the leading edge 266 eventually reaches the center 229 of the front edge 226 the divider wall 220 will have been sufficiently lifted by the progressive contact between leading edge 266 and front edge 226.

For example, FIGS. 4C, 5C, and 6C shows the electronics tray 260 at a further point of insertion into the receptacle in the frame 210. At this point of insertion, the points of contact between the lead edge 266 and the front edge 226 have moved even farther inward, as indicated by contact zones 292 and 293. Thus, the regions of contact or overlap 276 are extended further from each side 222 and 224 along the front edge 226 up to contact zones 292 and 293. The remaining portion of front edge 266 remains in the region of no contact 275. As shown in FIG. 6B, the amount of droop in divider wall 220 is very small compared to the amount of droop shown in FIG. 6A. In particular, in progressing from the state shown in FIG. 6B to the state shown in FIG. 6C, the points of contact move farther inward and therefore the length of the unsupported portion of the front edge 226 is reduced, which has the effect of reducing the amount of droop.

FIGS. 4D, 5D, and 6D shows the electronics tray 260 at still a further point of insertion into the receptacle in the frame 210. At this point of insertion, the points of contact between the lead edge 266 and the front edge 226 have moved even farther inward, as indicated by contact zones 294 and 295. Thus, the regions of contact or overlap 276 are even closer to the center 229 of the leading edge 226, extending from the sides 222 and 224 up to contact zones 294 and 294. The small portion of front edge 266 around center 229 remains in the region of no contact 275 with leading edge 266. As shown in FIG. 6B, the droop in divider wall 220 is almost completely eliminated. In particular, because the points of contact are now fairly close together, only a small length of the front edge 226 remains unsupported and thus there is little to no droop.

After the state illustrate in FIGS. 4D, 5D, and 6D, the tray 260 may be inserted farther into the receptacle 221, until eventually the contact points between the lead edge 266 and the front edge 226 merge at the center 229 (not illustrated). At this point, the droop in the divider wall 220 is effectively eliminated (or at least reduced to the point of no longer causing interference). After this, continued insertion of the tray 260 results in the lead edge 266 passing under the front edge 226 and moving rearward until the fully installed state illustrated in FIG. 7 is achieved.

In some implementations, the tray 260 may include structural features that ensure that only the leading edge 266 and the tabs 263 and 265 (if present) with the front edge 226 of the divider wall 220 as the electronics tray is engaged and inserted into the receptacle up to the center point 229 in the frame 210. For example, the leading edge 266 may have a height that is equal to or slightly greater than the height of the remaining portion of the electronics tray 260. Further, the leading edge 266 may have a height that is greater than the height of any external structures, such as electronic connectors, located forward of the leading edge 266 at the back of the electronics tray 260.

Figure 7:
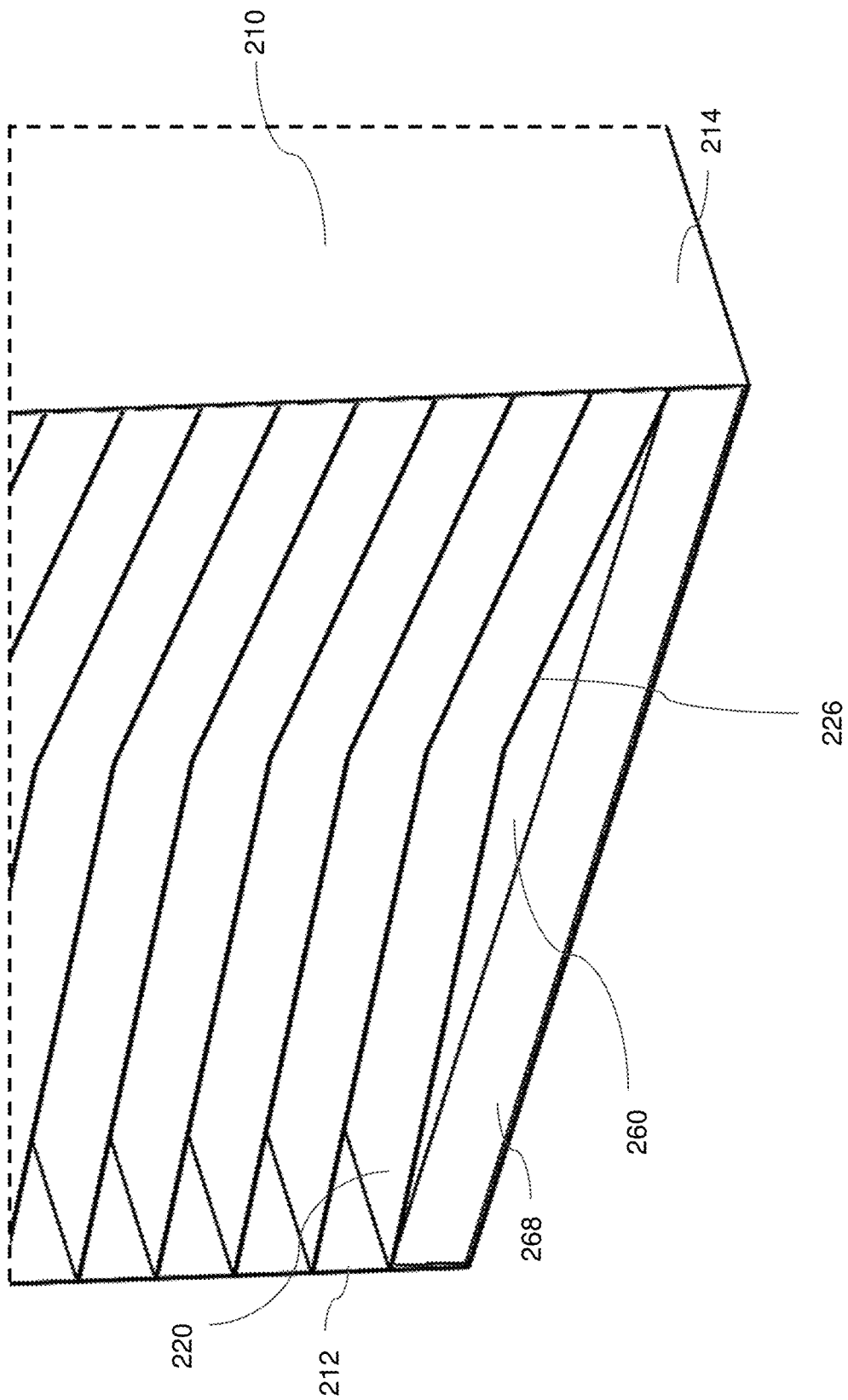
FIG. 7 shows a perspective view of the electronics tray along with the system chassis of FIGS. 4A-4D with the electronics tray attached to the system chassis.

FIG. 7 shows a perspective view of the electronics tray 260 fully inserted and attached to the frame 210. The divider wall 220 rests on all or a portion of the top surface of the electronics tray 260 with the droop eliminated, similar to that shown for divider wall 120a described above. As shown in FIG. 7, the front face 268 of the electronics tray 260 is shown flush with the front of the frame 210. In other implementations, the front face may be recessed or protruding. Further, some implementations may include an additional mechanism for attaching electronics tray 260 to the frame 210 in order to hold the electronics tray 260 in a fixed position. The attachment mechanism may be permanent, semi-permanent, or removable. The attachment mechanism may be present at the front, the back, and/or the sides of the electronics tray 260. The attachment mechanism may include a latch or some form of fastening using fasteners, such as screws, or may include some form of clamping that applies a force against either the electronics tray or the frame 210.

Figure 8:
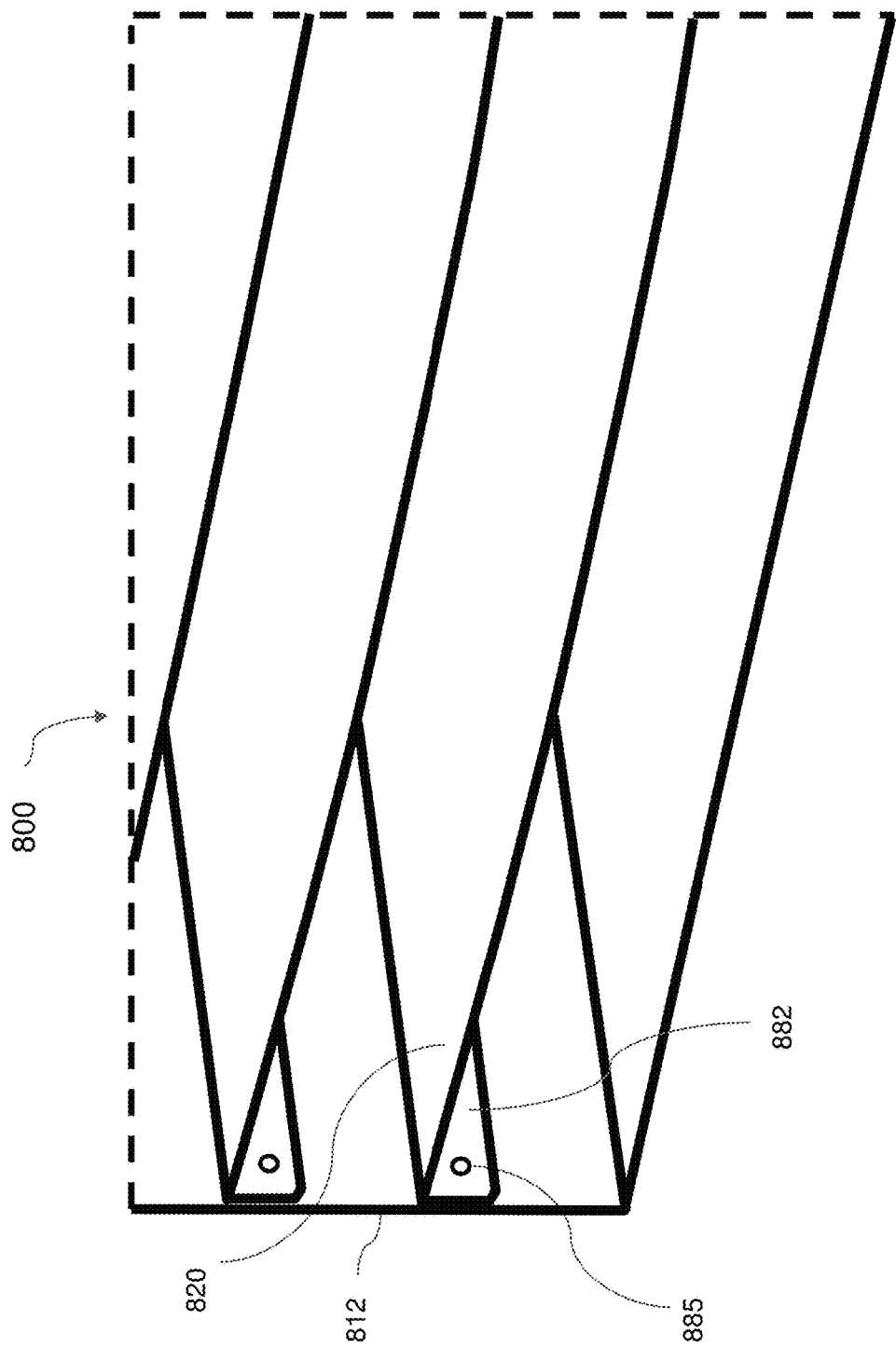
FIG. 8 shows a perspective view of another system chassis.
Figure 9:
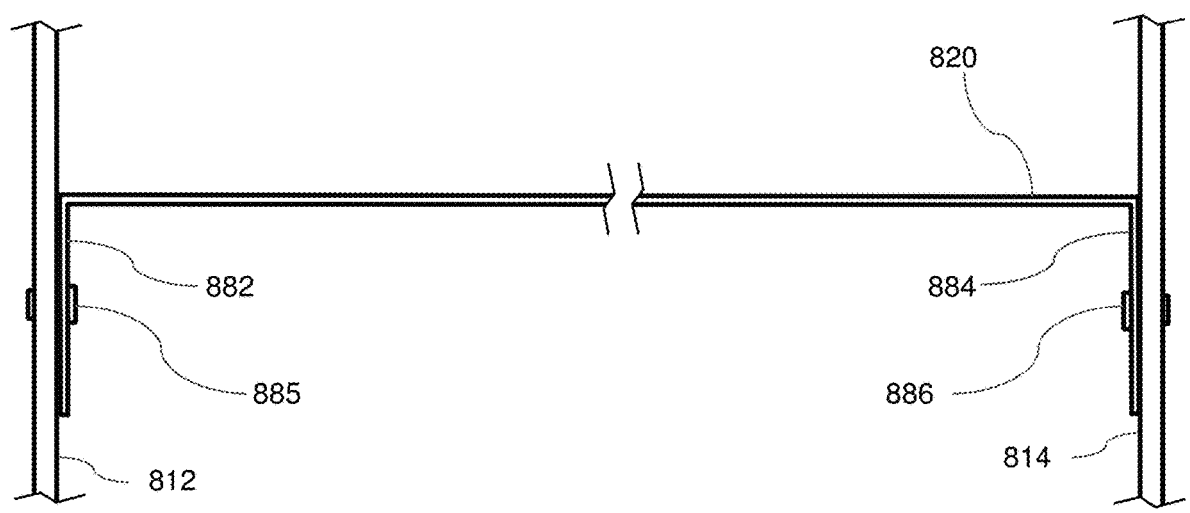
FIG. 9 shows a front view of the system chassis of FIG. 8.

Turning now to FIGS. 8-9, a system chassis 800 in accordance with various aspects of the disclosure will be described. The system chassis 800 may be a configuration of the system chassis 100 or 200 described above. Thus, various components of the system chassis 800 may be similar to components of the system chassis 100 and 200 described above. The above descriptions of components of the system chassis 100 and 200 are applicable to the similar components of the system chassis 800, and thus duplicative descriptions are omitted below to improve clarity. Similar components of the system chassis 100, 200, and 800 are given reference numbers having the same last two digits, such as 110, 210, and 810. Although the system chassis 800 may be one configuration of the system chassis 100 or 200, the system chassis 100 or 200 are not limited to the configuration of system chassis 800.

FIGS. 8 and 9 show a perspective view and a front view of the system chassis 800, respectively. In this example, the divider walls 820 each comprise support structures 882 and 884 located on opposite lateral sides thereof. As shown in FIGS. 8 and 9, these support structures 882 and 884 extend along and are coupled to the lateral walls 812 and 814, respectively of the frame in the system chassis 880. In some examples the support structures 882 and 884 extend from the front to the back of the frame. Each of the support structures 882 and 884 may extend along all or a portion of the lateral walls 812 and 814, respectively. Each of the support structures 882 and 884 are attached to the lateral walls 812 and 814 using mechanical fasteners. As shown, support structure 882 is attached to side wall 812 using a rivet 885. Support structure 884 is attached to side wall 814 using a rivet 886 (shown in FIG. 9). In other implementations, different mechanical fasteners, such as screws, nuts, and bolts, may be used. Although one mechanical (e.g., rivet) fastener is shown, more than one mechanical fastener may be used, spanning the length of the support structures 882 and 884. Additionally, in some implementations, the support structures 882 and 884 may be attached through other attachment mechanisms, such as welding, adhesive, engagement with flanges or other engagement structures attached to the lateral walls 812 and 814, or any other attachment mechanism.

As shown, each of the support structures 882 and 884 are formed as part of the divider wall 820. The support structures 882 and 884 are formed as flanges that are orthogonal to, and positioned below (or in other examples, above), the horizontal portion of the divider wall 820. For example, the divider wall 820 may be formed from a metal sheet that is bent along two parrallel lines near opposite sides thereof to form the support structures 882 and 884. In this manner, the support structures 882 and 884 are integrally connected to the divider wall 820. In other implementations, the support structures 882 and 884 may be positioned above the divider wall 820. In some implementations, the support structures 882 and 884 may be separate from the divider wall 820. In these implementations, the support structures 882 and 884 may be affixed to the divider wall 820 by fasteners, welding, adhesives, etc., or the divider wall 820 may rest upon the support structure 882 and 884 without necessarily being affixed thereto.

FIG. 10 is a top view of another example of a divider wall 1020. The divider wall 1020 is one example configuration of the divider wall 120 of the system chassis 100. Moreover, in some example the divider wall 1020 may be used in the system chassis 200 or 800 in lieu of the divider walls 220 or 820 thereof. In this example, the concave shape of the front edge 1026 has a curved shape toward the back edge 1028. This is in contrast to the more angular concave shape formed from straight line segments in the divider wall 220 of FIG. 3. The distance from the front edge 1026 to the back edge 1028 along the side edge 1024 is shown as distance 1074. The distance between the front edge 1026 and the back edge 1028 continuously decreases while moving along the front edge 1026 to a center point 1029, shown as distance 1073. Similarly, the distance from the front edge 1026 to the back edge 1028 along the side edge 1022 continuously decreases while moving along the front edge 1026 to the center point 1029, with the same distance 1074 and 1073, respectively. As described above, the depth of the concave shape may depend on several factors that affect the amount of bend or bow that is present in the divider wall 1020. In some examples, the depth is three inches, similar to the depth of divider wall 220 described above. In other examples, the depth may have a different value, including values greater or less than three inches.

As shown in FIG. 10, the curved shape of the front edge 1026 is in the shape of a semicircle. Other curved shapes may also be used including, but not limited to, a parabola, a semi-ellipse, and a hyperbola. More complex concave shapes may also be used, such as an acoustic horn or pointed arch, which is similar to a combination of a V-shape and a curved shape, or a curve obtained by mirroring one or more curved segments across the center 1029 (such as mirroring an exponential or logarithmic curve across the center 1029).

In the examples discussed above thus far, the convex shape of the front edge is generally symmetric across a center thereof. However, in other examples, the convex shape is not necessarily symmetric. For example, with reference to the divider wall 1020, the front edge 1026 may comprise a curved segment between the side edge 1022 and the center point 1029 that is different from a curved segment used between the side edge 1024 and the center point 1029, as long as both curved segments are continuously decreasing when moving inward from the lateral edges 1022 or 1024 towards the center point 1029.

Figure 11:
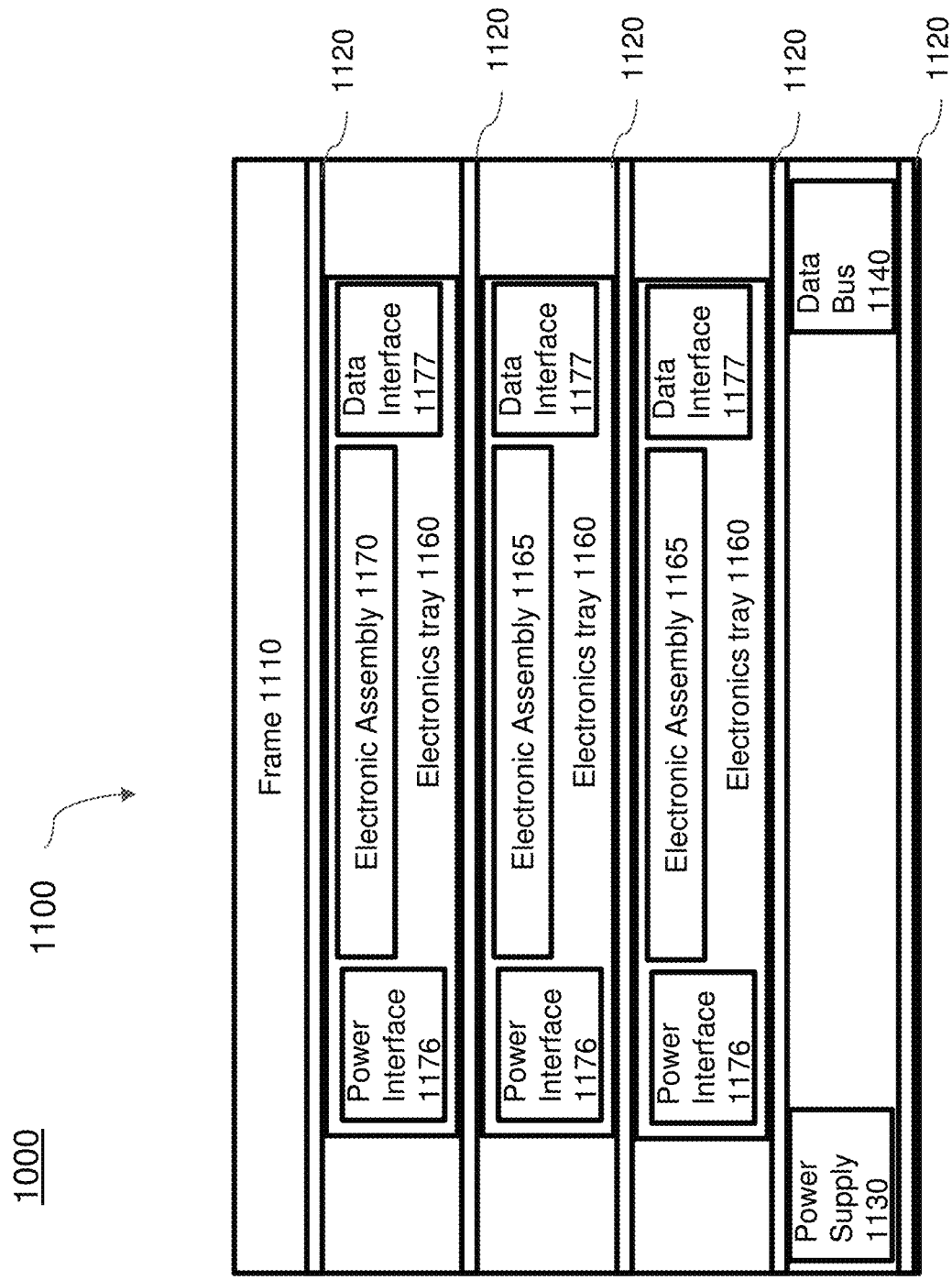
FIG. 11 is a block diagram illustrating a compute system.

FIG. 11 is a block diagram conceptually illustrating a compute system 1000. It should be understood that FIG. 11 is not intended to illustrate specific shapes, dimensions, or other structural details accurately or to scale, and that implementations of the compute system 1000 may have different numbers and arrangements of the illustrated components and may also include other parts that are not illustrated. Compute system 1000 may be used as part of a multi-node parallel processing computer system.

The compute system 1000 comprises a system chassis 1100. The system chassis 1100 may be, for example, any of the system chassis 100, 200, or 800 described above. The system chassis 1100 comprises a frame 1110. Frame 1110 includes a set of divider walls 1120. The frame 1110 and the set of divider walls 1120 are coupled together in manner to form a set of receptacles in a manner similar to that described above. A set of electronics trays 1160 are shown attached to, or mounted in, the receptacles in the frame 1110. As shown, three electronics trays 1160 are shown attached to, or mounted in, three receptacles. In other implementations, compute system 1100 may be configured to accommodate more or fewer electronics trays similar to electronics tray 1160.

The frame 1110 and the divider walls 1120 can be formed out of a suitable structural material and configured in a manner similar to that described above. Notably, each of the divider walls 1120 include a front edge (not shown) that has a concave shape. The concave shape of the front edge may be similar to the V-shape described in FIG. 3, the curved shape described in FIG. 10, or other concave shapes may be used as long as the distance between the front edge and the back edge of the divider wall 1120 continuously decreases while moving laterally from one side edge to a center of the front edge and continuously increases while moving laterally from the center to an opposite side edge of the divider wall.

Each of the electronics trays 1160 includes one or more electronic assemblies 1170. The electronic assemblies 1170 may be mounted to the electronics trays using any well-known fastening mechanism. Each of the electronics assemblies 1170 may be configured to carry out the same operations and/or functions or may be configured to carry out different operations and/or functions as part of the operation of the compute system 1100. Examples of different types of electronic assemblies include, but are not limited to, a compute node, a storage node, a switch, and communication interface node.

In some implementations, each of the electronics trays 1160 may also include structural features, such as a frame, as well as separate top, bottom and/or side panels as described above. In some implementations, each of the electronics trays 1160 may further include structural features associated with the leading edge of the electronics tray, as well as guide structures, such as side tabs, that assist with alignment, engagement, and insertion of the electronics tray as part of mounting or attaching the electronics trays 1160 to the frame 1110.

The system chassis 1100 further includes a power supply 1130 and a data bus 1140. Additionally, each of the electronics trays 1160 also includes a power interface 1176 and a data interface 1177. The power supply 1130 is connected to the power interface 1176 on each of the electronics trays 1160 and supplies electrical power for operations on the electronic assemblies 1170. The data bus 1140 provides a data and signal communication interconnection between the electronic assemblies 1170 in each of the electronics trays 1160 through the data interfaces 1177. In some implementations, one or both of the power interface 1176 and data interface 1177 are located on the back of the system tray. In some implementations, one or both of the connections between the power interfaces 1176 and the power supply 1130 and the data interfaces 1177 and the data bus 1140 may be made using either a backplane connection interface or a midplane connection interface on the system chassis 1100.

In some examples, compute system 1100 comprises an HPC system, such as an HPE Cray EX system, an HPE Apollo system, or other HPC systems. In some examples, compute system 1100 comprises a converged or hyperconverged computing system, such as an HPE ConvergedSystem, an HPE SimpliVity system, or other converged/hyperconverged system. In some examples, compute system 1100 comprises a collection of individual servers, such as HPE ProLiant servers or other servers.

Figure 12:
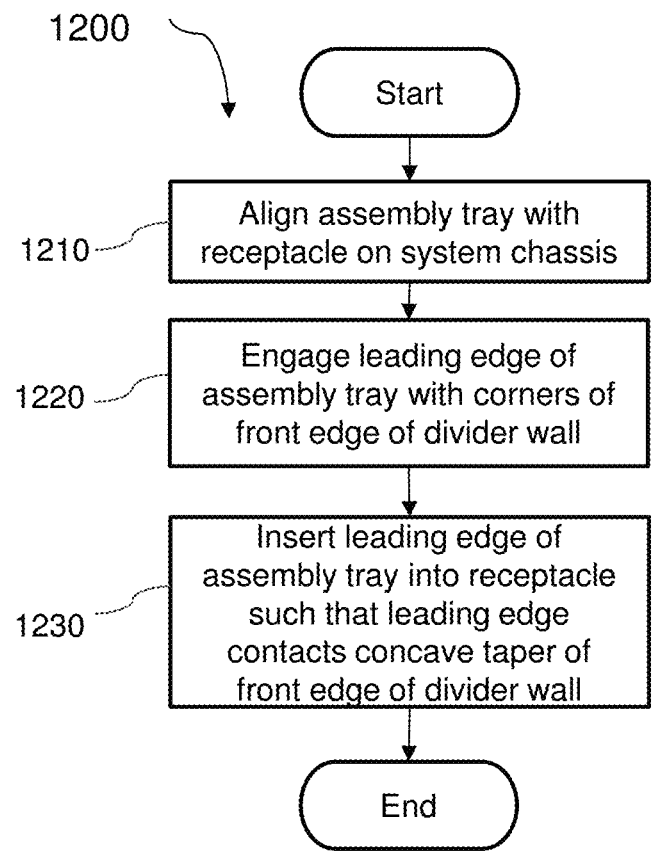
FIG. 12 is a process flow diagram illustrating an example process for attaching an electronics tray to a system chassis.

FIG. 12 describes an example process 1200 for attaching an electronics tray, such as electronics tray 260 into a system chassis, such as system chassis 200. In block 1210, an electronics tray 260 containing an electronic assembly 270 is aligned with an opening in a receptacle formed by two divider walls 220 and the sides of the frame 210 in the system chassis 200. One or more of the divider walls 220 has a front edge 226 that has a concave shape as described above. The alignment is carried out in a manner similar to that described in FIGS. 4A, 5A, and 6A. Notably, as shown in FIGS. 4A and 5A, one or both of the side tabs 263 and 265 are aligned with the side walls 222 and 224 of the frame 210.

In block 1220, a leading edge 266 of the electronics tray 260 is engaged with the receptacle in the frame 210. The engagement of the electronics tray 260 is carried out in a manner similar to that described above in FIGS. 4B, 5B, and 6B. Notably, one or both of the corners of the leading edge 266 make contact with the front edge 226 of the upper divider wall 220 used to form the receptacle at, or near, one or both of the corners of the front edge 226 near the side edges 222 and 224.

In block 1230, the electronics tray 260 is inserted into the receptacle in the frame 210. The insertion is carried out in a manner similar to that described above in FIGS. 4C, 5C, and 6C, as well as FIGS. 4D, 5C, and 6C. Notably, a region of contact progressively advances along the concave shaped front edge 226 from an initial point of engagement, in block 1220, until the leading edge 266 of the electronics tray 260 reaches a center point 229 on the front edge 220. As the region of contact progresses to the center point 229, the bend or bow that is initially present in the divider wall 220 is removed. The electronics tray 260 can be further inserted into the receptacle without interference between the divider wall 220 and the electronics tray 260.

In some implementations, the electronics tray 260 may include more than one electronic assembly 270. Additionally In some implementations, the electronics tray 260 may include one or more of a power interface connector (e.g., power interface 1176) and a data interface connector (e.g., data interface 1177). Further these power interface connectors and data interface connectors may connect to other electronics trays 260 attached to the system chassis 200 through either a backplane connection interface or a midplane connection interface on the system chassis 200. In this manner, system chassis 200 may be configured as a compute system, such as compute system 1100.

In the description above, various types of electronic circuitry are described. As used herein, "electronic" is intended to be understood broadly to include all types of circuitry utilizing electricity, including digital and analog circuitry, direct current (DC) and alternating current (AC) circuitry, and circuitry for converting electricity into another form of energy and circuitry for using electricity to perform other functions. In other words, as used herein there is no distinction between "electronic" circuitry and "electrical" circuitry. In some cases, certain electronic circuitry may comprise processing circuitry. Processor or processing circuitry comprises circuitry configured with logic for performing the various operations. The logic of the processing circuitry may comprise dedicated hardware to perform various operations, software (machine readable and/or processor executable instructions) to perform various operations, or any combination thereof. In examples in which the logic comprises software, the processing circuitry may include a processor to execute the software instructions and a memory device that stores the software. The processor may comprise one or more processing devices capable of executing machine readable instructions, such as, for example, a processor, a processor core, a central processing unit (CPU), a controller, a microcontroller, a system-on-chip (SoC), a digital signal processor (DSP), a graphics processing unit (GPU), etc. In cases in which the processing circuitry includes dedicated hardware, in addition to or in lieu of the processor, the dedicated hardware may include any electronic device that is configured to perform specific operations, such as an Application Specific Integrated Circuit (ASIC), a Field Programmable Gate Array (FPGA), a Complex Programmable Logic Device (CPLD), discrete logic circuits, a hardware accelerator, a hardware encoder, etc. The processing circuitry may also include any combination of dedicated hardware and processor plus software.

It is to be understood that both the general description and the detailed description provide examples that are explanatory in nature and are intended to provide an understanding of the present disclosure without limiting the scope of the present disclosure. Various mechanical, compositional, structural, electronic, and operational changes may be made without departing from the scope of this description and the claims. In some instances, well-known circuits, structures, and techniques have not been shown or described in detail in order not to obscure the examples. Like numbers in two or more figures represent the same or similar elements.

Further, spatial, positional, and relational terminology used herein is chosen to aid the reader in understanding examples of the implementations but is not intended to limit the implementation to a particular reference frame, orientation, or positional relationship. For example, spatial, positional, and relational terms such as "up", "down", "lateral", "beneath", "below", "lower", "above", "upper", "proximal", "distal", and the like may be used herein to describe directions or to describe one element's or feature's spatial relationship to another element or feature as illustrated in the figures. These spatial terms are used relative to reference frames in the figures and are not limited to a particular reference frame in the real world. Thus, for example, the direction "up" in the figures does not necessarily correspond to an "up" in a world reference frame (e.g., away from the Earth's surface). Furthermore, if a different reference frame is considered than the one illustrated in the figures, then the spatial terms used herein may need to be interpreted differently in that different reference frame. For example, the direction referred to as "up" in relation to one of the figures may correspond to a direction that is called "down" in relation to a different reference frame that is rotated 180 degrees From the figure's reference frame. As another example, if a device is turned over 180 degrees in a world reference frame as compared to how it was illustrated in the figures, then an item described herein as being "above" or "over" a second item in relation to the Figures would be "below" or "beneath" the second item in relation to the world reference frame. Moreover, the poses of items illustrated in the figure are chosen for convenience of illustration and description, but in an implementation in practice the items may be posed differently.

In addition, the singular forms "a," "an," and "the" are intended to include the plural forms as well, unless the context indicates otherwise. Moreover, the terms "comprises," "comprising," "includes," and the like specify the presence of stated features, steps, operations, elements, and/or components but do not preclude the presence or addition of one or more other features, steps, operations, elements, components, and/or groups. Components described as coupled may be electronically or mechanically directly coupled, or they may be indirectly coupled via one or more intermediate components, unless specifically noted otherwise. Mathematical and geometric terms are not necessarily intended to be used in accordance with their strict definitions unless the context of the description indicates otherwise, because a person having ordinary skill in the art would understand that, for example, a substantially similar element that functions in a substantially similar way could easily fall within the scope of a descriptive term even though the term also has a strict definition.

Provide: As used herein, to "provide" an item means to have possession of and/or control over the item. This may include, for example, forming (or assembling) some or all of the item from its constituent materials and/or, obtaining possession of and/or control over an already-formed item.

And/or: Occasionally the phrase "and/or" is used herein in conjunction with a list of items. This phrase means that any combination of items in the list—from a single item to all of the items and any permutation in between—may be included. Thus, for example, "A, B, and/or C" means "one of {A}, {B}, {C}, {A, B}, {A, C}, {C, B}, and {A, C, B}."

Elements and their associated aspects that are described in detail with reference to one example may, whenever practical, be included in other examples in which they are not specifically shown or described. For example, if an element is described in detail with reference to one example and is not described with reference to a second example, the element may nevertheless be claimed as included in the second example.

Unless otherwise noted herein or implied by the context, when terms of approximation such as "substantially," "approximately," "about," "around," "roughly," and the like, are used, this should be understood as meaning that mathematical exactitude is not required and that instead a range of variation is being referred to that includes but is not strictly limited to the stated value, property, or relationship. In particular, in addition to any ranges explicitly stated herein (if any), the range of variation implied by the usage of such a term of approximation includes at least any inconsequential variations and also those variations that are typical in the relevant art for the type of item in question due to manufacturing or other tolerances. In any case, the range of variation may include at least values that are within ±1% of the stated value, property, or relationship unless indicated otherwise.

Further modifications and alternative examples will be apparent to those of ordinary skill in the art in view of the disclosure herein. For example, the devices and methods may include additional components or steps that were omitted from the diagrams and description for clarity of operation. Accordingly, this description is to be construed as illustrative only and is for the purpose of teaching those skilled in the art the general manner of carrying out the present teachings. It is to be understood that the various examples shown and described herein are to be taken as exemplary. Elements and materials, and arrangements of those elements and materials, may be substituted for those illustrated and described herein, parts and processes may be reversed, and certain features of the present teachings may be utilized independently, all as would be apparent to one skilled in the art after having the benefit of the description herein. Changes may be made in the elements described herein without departing from the scope of the present teachings and following claims.

It is to be understood that the particular examples set forth herein are non-limiting, and modifications to structure, dimensions, materials, and methodologies may be made without departing from the scope of the present teachings.

Other examples in accordance with the present disclosure will be apparent to those skilled in the art from consideration of the specification and practice of the implementations disclosed herein. It is intended that the specification and examples be considered as exemplary only, with the following claims being entitled to their fullest breadth, including equivalents, under the applicable law.

What is claimed is:

1. A system chassis, comprising:
   a frame having a width, depth, and height; and
   a plurality of divider walls coupled to the frame and forming a plurality of receptacles each configured to receive an electronics tray containing an electronic assembly,
   wherein each of the plurality of divider walls comprises a metal sheet having a front edge, a back edge, and two lateral edges, the two lateral edges attached to two lateral walls of the frame, and
   wherein the front edge of the metal sheet has a concave shape such that a distance between the front edge and the back edge of the metal sheet continuously decreases while moving laterally from one of the lateral edges to a center of the front edge and continuously increases while moving laterally from the center to the other one of the lateral edges.

2. The system chassis of claim 1, wherein the concave shape is symmetrical about the center of the front edge.

3. The system chassis of claim 1, wherein the concave shape is one of a V shape and a curved shape.

4. The system chassis of claim 1, wherein a portion of a leading edge of the electronics tray contacts a portion of the front edge of at least one of the divider walls that form one of the plurality of receptacles while the receptacle is receiving the electronics tray.

5. The system chassis of claim 1, wherein the concave shape prevents interference between the electronics tray and at least one of the divider walls that form one of the plurality of receptacles while the receptacle is receiving the electronics tray.

6. The system chassis of claim 1, wherein the system chassis has a width of at least 30 inches.

7. The system chassis of claim 1, wherein each of the plurality of divider walls further comprises two support structures extending along each of the two side edges, the two support structures attaching the plurality of divider walls to the frame.

8. The system chassis of claim 7, wherein the two support structures are integrally connected to the metal sheet and orthogonal to the metal sheet.

9. The system chassis of claim 7, wherein the support structures are attached to the frame of the system chassis using mechanical fasteners.

10. A compute system comprising:
a system chassis, the system chassis comprising:
a frame having a width, depth, and height; and
a plurality of divider walls coupled to the frame and forming a plurality of receptacles, each of the plurality of divider walls comprising a metal sheet having a front edge, a back edge, and two lateral edges, the two lateral edges attached to two lateral walls of the frame; and
a plurality of electronics trays, each of the plurality of system trays mounted into one of the plurality of receptacles, each electronics tray including at least one electronic assembly, each of the plurality of electronics trays mounted in one of the plurality of receptacles,
wherein the front edge of the metal sheet has a concave shape such that a distance between the front edge and the back edge of the metal sheet continuously decreases while moving laterally from one of the lateral edges to a center of the front edge and continuously increases while moving laterally from the center to the other one of the lateral edges.

11. The compute system of claim 10, wherein the concave shape is symmetrical about the center of the front edge.

12. The compute system of claim 10, wherein the concave shape is one of a V shape and a curved shape.

13. The compute system of claim 10, wherein each of the electronics trays includes a frame, such that a portion of a leading edge of the frame contacts a portion of the front edge of at least one of the divider walls that form one of the receptacles while the electronics trays are inserted in the receptacle.

14. The compute system of claim 13, wherein each of the plurality of electronics trays includes at least one of a guide structure along each side of the frame that assists with alignment and engagement of the plurality of electronics trays with the plurality of receptacles and structural features on a leading edge of each of the plurality of electronics trays to ensure a first contact between a portion of the leading edge and a portion of the front edge of the plurality of divider walls during insertion of the plurality of electronics trays.

15. The compute system of claim 10, wherein the concave shape prevents interference between the electronics trays and the divider walls that form the receptacles while the electronics trays are mounted in the receptacles.

16. The compute system of claim 10, wherein the system chassis has a width of at least 30 inches.

17. The compute system of claim 10, wherein the electronic assembly includes at least one of a compute node, a storage node, a switch, and a communication interface node.

18. The compute system of claim 10, wherein the system chassis further includes a power supply and a data bus, and wherein each of the plurality of electronics trays further includes a power interface connector and a data interface connector, the power interface connector and data interface connector connecting to the power supply and the data bus included in the system chassis.

19. The compute system of claim 18, wherein at least one of the connections between the power interface connector of each of the plurality of electronics trays to the power supply and the connections between the data interface connector of each of the plurality of electronics trays to the data bus is made using a backplane connection interface on the system chassis.

20. A method comprising;
aligning an electronics tray containing an electronic assembly to an opening in a receptacle in a system chassis, the receptacle formed by a frame in the system chassis and two divider walls attached to the frame, wherein a front edge of the two divider walls has a concave shape such that a distance between the front edge and the back edge of the metal sheet continuously decreases while moving laterally from one side edge to a center of the front edge and continuously increases while moving laterally from the center to an opposite side edge;
engaging a leading edge of the electronics tray with at least one corner of the front edge of at least one of the two divider walls forming the receptacle; and
inserting the electronics tray into the receptacle such that the leading edge of the electronics tray contacts the front edge of the at least one of the divider walls over an increasing region of contact up to the center of the front edge.

21. The method of claim 20, wherein the front edge of the at least one of the divider walls prevents interference between the electronics tray and at least one of the plurality of divider walls during insertion of the electronics tray during the insertion into the receptacle.

* * * * *